US011223786B2

(12) United States Patent
Sato et al.

(10) Patent No.: US 11,223,786 B2
(45) Date of Patent: Jan. 11, 2022

(54) IMAGING DEVICE INCLUDING SIGNAL LINE AND UNIT PIXEL CELL INCLUDING CHARGE STORAGE REGION

(71) Applicant: Panasonic Intellectual Property Management Co., Ltd., Osaka (JP)

(72) Inventors: Yoshihiro Sato, Osaka (JP); Junji Hirase, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 396 days.

(21) Appl. No.: 16/243,921

(22) Filed: Jan. 9, 2019

(65) Prior Publication Data

US 2019/0166319 A1 May 30, 2019

Related U.S. Application Data

(63) Continuation of application No. 14/955,086, filed on Dec. 1, 2015, now Pat. No. 10,212,372.

(51) Int. Cl.
*H04N 5/363* (2011.01)
*H04N 5/378* (2011.01)
(Continued)

(52) U.S. Cl.
CPC ....... *H04N 5/363* (2013.01); *H01L 27/14603* (2013.01); *H01L 27/14612* (2013.01);
(Continued)

(58) Field of Classification Search
CPC ........ H04N 5/363; H04N 5/365; H04N 5/374; H01L 27/14603; H01L 27/14612;
(Continued)

(56) References Cited

U.S. PATENT DOCUMENTS 6,777,660 B1 8/2004 Lee
2005/0168618 A1 8/2005 Okita et al.
(Continued)

FOREIGN PATENT DOCUMENTS

JP 2000-241557 A 9/2000
JP 2001-177084 A 6/2001
(Continued)

OTHER PUBLICATIONS

Notice of Allowance issued in related U.S. Appl. No. 14/955,086 dated Oct. 11, 2018.
(Continued)

*Primary Examiner* — Kevin K Pyo
(74) *Attorney, Agent, or Firm* — McDermott Will & Emery LLP

(57) ABSTRACT

An imaging device includes first and second pixels, arranged in a first direction, each of which includes: a photoelectric converter converting incident light into signal charge; an impurity region, in a semiconductor substrate, coupled to the photoelectric converter; a first transistor having a first gate coupled to the impurity region, and first source and drain; and a second transistor having second gate, source and drain. One of the second source and the second drain is the impurity region, and another is coupled to the first source or the first drain. The imaging device further includes a signal line, coupled to the first source or the first drain, and extends along the first direction and overlaps with both of the first and second pixels. The signal line is located on an opposite side from the impurity region across a center line of the first pixel.

14 Claims, 17 Drawing Sheets

(51) Int. Cl.
*H04N 5/361* (2011.01)
*H04N 5/374* (2011.01)
*H01L 27/146* (2006.01)

(52) U.S. Cl.
CPC .. *H01L 27/14623* (2013.01); *H01L 27/14636* (2013.01); *H01L 27/14638* (2013.01); *H01L 27/14665* (2013.01); *H04N 5/361* (2013.01); *H04N 5/374* (2013.01); *H04N 5/378* (2013.01)

(58) Field of Classification Search
CPC ......... H01L 27/14623; H01L 27/14636; H01L 27/14638
See application file for complete search history.

(56) References Cited

U.S. PATENT DOCUMENTS

| | | |
|---|---|---|
| 2012/0086095 A1 | 4/2012 | Nishiyama et al. |
| 2012/0200752 A1 | 8/2012 | Matsunaga |
| 2013/0038760 A1 | 2/2013 | Blanquart et al. |
| 2013/0099093 A1 | 4/2013 | Kawanabe et al. |
| 2013/0341491 A1 | 12/2013 | Hirose et al. |
| 2014/0085523 A1 | 3/2014 | Hynecek |
| 2015/0077606 A1 | 3/2015 | Ohtsuki et al. |
| 2015/0084106 A1 | 3/2015 | Nakanishi et al. |
| 2015/0115339 A1 | 4/2015 | Tamaki et al. |
| 2016/0191825 A1 | 6/2016 | Sato et al. |
| 2020/0036915 A1* | 1/2020 | Machida ............ H04N 9/04553 |

FOREIGN PATENT DOCUMENTS

| | | |
|---|---|---|
| JP | 2005-217366 A | 8/2005 |
| JP | 2009-165186 A | 7/2009 |
| JP | 2012-147169 A | 8/2012 |
| JP | 2013-030820 A | 2/2013 |
| JP | 2013-089869 A | 5/2013 |
| JP | 2016-127265 A | 7/2016 |
| WO | 2010/116974 A1 | 10/2010 |
| WO | 2011/058684 A1 | 5/2011 |
| WO | 2014/002365 A1 | 1/2014 |
| WO | 2014/002367 A1 | 1/2014 |
| WO | 2014/002420 A1 | 1/2014 |

OTHER PUBLICATIONS

Final Office Action issued in related U.S. Appl. No. 14/955,086 dated Jun. 20, 2018.
Non-Final Office Action issued in related U.S. Appl. No. 14/955,086 dated Oct. 17, 2017.
Non-Final Office Action issued in related U.S. Appl. No. 14/955,086 dated Oct. 11, 2016.

* cited by examiner

IMAGING DEVICE INCLUDING SIGNAL LINE AND UNIT PIXEL CELL INCLUDING CHARGE STORAGE REGION

CROSS REFERENCE

This application is the Continuation application of U.S. application Ser. No. 14/955,086 filed on Dec. 1, 2015, which claims the benefit of Japanese Application Nos. 2014-264697 and 2015-207382 filed on Dec. 26, 2014 and Oct. 21, 2015, respectively, the entire contents of each are hereby incorporated by reference.

BACKGROUND

1. Technical Field

The present disclosure relates to an imaging device and more particularly to an imaging device that has a photoelectric conversion unit which includes a photoelectric conversion film and is laminated on a semiconductor substrate.

2. Description of the Related Art

A laminated type imaging device has been suggested as a metal oxide semiconductor (MOS) type imaging device. In the laminated type imaging device, a photoelectric conversion unit is laminated on the outermost surface of a semiconductor substrate, and charge generated through photoelectric conversion in the photoelectric conversion film is stored in a charge storage region (also referred to as "floating diffusion region"). The imaging device uses a charge coupled device (CCD) circuit or a complementary MOS (CMOS) circuit in the semiconductor substrate to read out the stored charge. For example, International Publication No. 2014/002367 discloses such an imaging device.

There has been a desire for noise reduction in the field of imaging devices. Particularly, it is desired that kTC noise (also referred to as "reset noise") that occurs at resetting be reduced. As illustrated in FIG. 1, above International Publication No. 2014/002367 discloses an imaging device that is provided with a feedback circuit which negatively feeds back output of an amplifier transistor (21) in a unit pixel cell (20). International Publication No. 2014/002367 suggests reduction in the influence of kTC noise by forming the feedback circuit at a reset time of a charge storage node (25) (paragraph [0033]).

In the imaging device disclosed in International Publication No. 2014/002367, power supply wiring (27) is arranged between a feedback signal line (30) and metal wiring (40) in the same layer as the feedback signal line (30), among the feedback signal line (30) that is connected with an output terminal of a feedback amplifier (31) and the charge storage node (25). This reduces the coupling capacitance between the feedback signal line (30) and the metal wiring (40). The disclosure of International Publication No. 2014/002367 will be incorporated by reference herein in its entirety.

Japanese Patent No. 3793202 discloses that plural shield layers connected together by a pin are arranged between output lines. Japanese Patent No. 3793202 also discloses that such a configuration enables crosstalk between mutually adjacent output lines to be reduced.

SUMMARY

It is desired that the influence of noise such as kTC noise be further reduced.

One non-limiting and exemplary embodiment provides the following.

In one general aspect, the techniques disclosed here feature an imaging device comprising: first and second pixels that are arranged in a first direction, each of the first and second pixels including: a photoelectric converter that converts incident light into signal charge; an impurity region in a semiconductor substrate, the impurity region being coupled to the photoelectric converter; a first transistor having a first gate, a first source and a first drain, the first gate being coupled to the impurity region; and a second transistor having a second gate, a second source and a second drain, the second transistor including the impurity region as one of the second source and the second drain, the other of the second source and the second drain being coupled to either the first source or the first drain; and a signal line that extends along the first direction and that overlaps with both of the first and second pixels in a plan view, one of the first source and the first drain being coupled to the signal line; wherein in the plan view, the signal line is located on an opposite side from the impurity region across a center line of the first pixel, the center line being in parallel with the direction and being an imaginary center line that halves, in the plan view, the first pixel.

It should be noted that general or specific embodiments may be implemented as an element, a device, a system, an integrated circuit, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
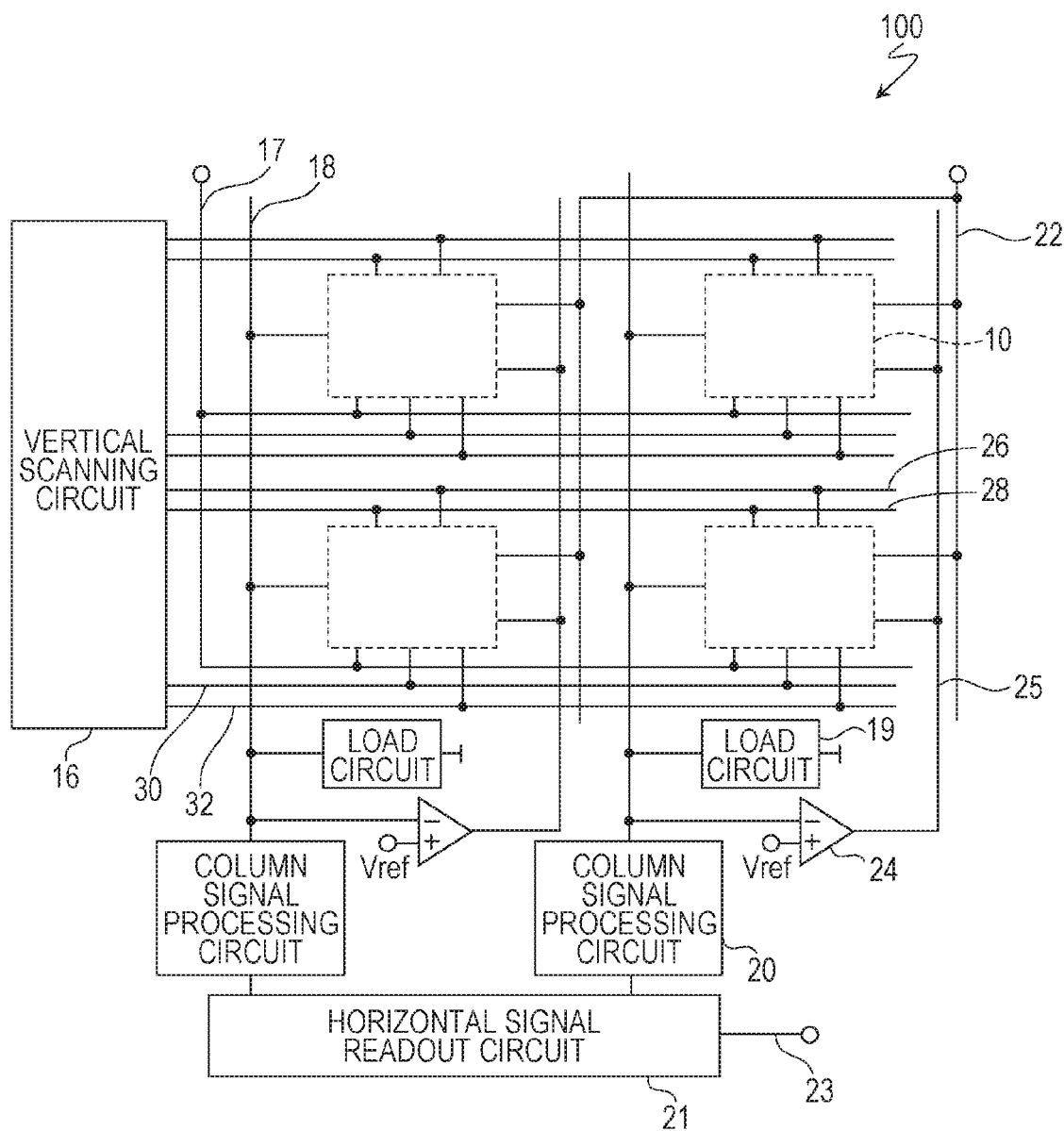
FIG. 1 is a schematic diagram that illustrates an exemplary circuit configuration of an imaging device according to a first embodiment.

Findings of the present inventor will be described before embodiments of the present disclosure are described in detail.

A laminated type imaging device typically has a structure in which a photoelectric conversion film and a circuit element formed on a semiconductor substrate are connected together by wiring and/or a wiring layer formed of metal (for example, see FIG. 3A of International Publication No. 2014/002367). Thus, a charge storage node in the laminated type imaging device typically includes a charge storage region formed on the semiconductor substrate.

In the technique disclosed in above International Publication No. 2014/002367, power supply wiring is interposed between a feedback signal line and metal wiring that configures a portion of the charge storage node, thereby reducing the coupling capacitance between the feedback signal line and the metal wiring. That is, the coupling capacitance between metal wirings is taken into consideration in International Publication No. 2014/002367. The present inventors focused on the coupling capacitance between the wiring that is present between the photoelectric conversion film and the semiconductor substrate and the charge storage region that is formed in the semiconductor substrate and has made the technique of the present disclosure.

The embodiments of the present disclosure will hereinafter be described in detail with reference to drawings. It should be noted that all the embodiments described below illustrate general or specific examples. Values, shapes, materials, elements, arrangement or connection manners of elements, steps, orders of steps, and so forth that are described in the following embodiments are merely illustrative and are not intended to limit the present disclosure. Various aspects described herein may be combined with each other unless the combination is contradictory. Further, the elements that are not described in the independent claims which provide the most superordinate concepts among the elements in the following embodiments will be described as arbitrary elements. In descriptions made below, elements having substantially equivalent functions will be denoted with the same reference characters, and descriptions about them may be omitted.

First Embodiment

FIG. 1 schematically illustrates an exemplary circuit configuration of an imaging device according to a first embodiment. An imaging device 100 illustrated in FIG. 1 includes plural unit pixel cells 10 and a peripheral circuit. The plural unit pixel cells 10 are two-dimensionally disposed on a semiconductor substrate and thereby form a photosensitive region (pixel region). The semiconductor substrate is not limited to a substrate that is formed of semiconductor as the whole. The semiconductor substrate may be an insulating substrate that is provided with a semiconductor layer on the surface on the side where the photosensitive region is formed.

In the example illustrated in FIG. 1, the plural unit pixel cells 10 are disposed in the row direction and the column direction. The row direction and the column direction are herein referred to as the respective directions in which the row and the column extend. That is, in the drawings, the vertical direction on the plane of paper is the column direction, and the horizontal direction is the row direction. The plural unit pixel cells 10 may be one-dimensionally disposed. In other words, the imaging device 100 may be a line sensor.

Each of the unit pixel cells 10 is connected with power supply wiring 22. A prescribed power supply voltage is supplied to the unit pixel cells 10 via the power supply wiring 22. As described below in detail, each of the unit pixel cells 10 includes a photoelectric conversion unit that has a photoelectric conversion film and is laminated on the semiconductor substrate. As described below in detail with reference to the drawings, the photoelectric conversion unit is provided on the semiconductor substrate via a wiring layer. Further, as illustrated in FIG. 1, the imaging device 100 has a storage control line 17 for applying the same constant voltage to all the photoelectric conversion units.

The peripheral circuit of the imaging device 100 includes a vertical scanning circuit (also referred to as "row scanning circuit") 16, a load circuit 19, a column signal processing circuit (also referred to as "row signal storage circuit") 20, a horizontal signal readout circuit (also referred to as "column scanning circuit") 21, and an inverting amplifier 24. In the configuration illustrated in FIG. 1, the column signal processing circuit 20, the load circuit 19, and the inverting amplifier 24 are arranged for each of rows formed of the unit pixel cells 10 that are two-dimensionally disposed. That is, in this example, the peripheral circuit includes plural column signal processing circuits 20, plural load circuits 19, and plural inverting amplifiers 24.

The vertical scanning circuit 16 is connected with an address signal line 30 and a reset signal line 26. The vertical scanning circuit 16 applies a prescribed voltage to the address signal line 30 and thereby selects the plural unit pixel cells 10 arranged in each row as a unit. Accordingly, readout of the signal voltages and resetting of pixel electrodes in the selected unit pixel cells 10 are executed.

In the example illustrated in FIG. 1, the vertical scanning circuit 16 is also connected with a feedback control line 28 and a sensitivity adjustment line 32. The vertical scanning circuit 16 applies a prescribed voltage to the feedback control line 28 and thereby enables a feedback circuit that negatively feeds back the output of the unit pixel cell 10 to be formed. Further, the vertical scanning circuit 16 may supply a prescribed voltage to the plural unit pixel cells 10 via the sensitivity adjustment line 32. As described below in detail, in the present disclosure, each of the unit pixel cells 10 includes one or more capacitors in the pixel. Herein, "capacitor" means a structure in which a dielectric such as an insulating film is interposed between electrodes. "Electrode" herein is not limited to an electrode formed of metal. "Electrode" widely includes a polysilicon layer and so forth. "Electrode" herein may be a portion of a semiconductor substrate.

The unit pixel cells 10 arranged in each of the columns are electrically connected with corresponding one of the column signal processing circuits 20 via corresponding one of the vertical signal lines 18. The vertical signal line 18 is electrically connected with the load circuit 19. The column signal processing circuit 20 performs noise suppression signal processing, which is represented by correlated double sampling, analog-digital conversion (AD conversion), and so forth. The plural column signal processing circuits 20 that are each provided to corresponding one of the columns of the unit pixel cells 10 are electrically connected with the horizontal signal readout circuit 21. The horizontal signal readout circuit 21 sequentially reads out signals from the plural column signal processing circuits 20 to a horizontal common signal line 23.

In the configuration exemplified in FIG. 1, the plural inverting amplifiers 24 are each provided to corresponding one of the columns. An input terminal on the negative side of the inverting amplifier 24 is connected with the corresponding vertical signal line 18. A prescribed voltage (for example, a positive voltage of 1 V or around 1 V) Vref is supplied to an input terminal on the positive side of the inverting amplifier 24. Further, an output terminal of the inverting amplifier 24 is connected with the plural unit pixel cells 10 that are connected with the input terminal on the negative side of the inverting amplifier 24, via a feedback line 25 that is correspondingly provided to the column. The inverting amplifier 24 configures a portion of the feedback circuit that negatively feeds back the output from the unit pixel cell 10. The inverting amplifier 24 may be referred to as feedback amplifier.

Figure 2:
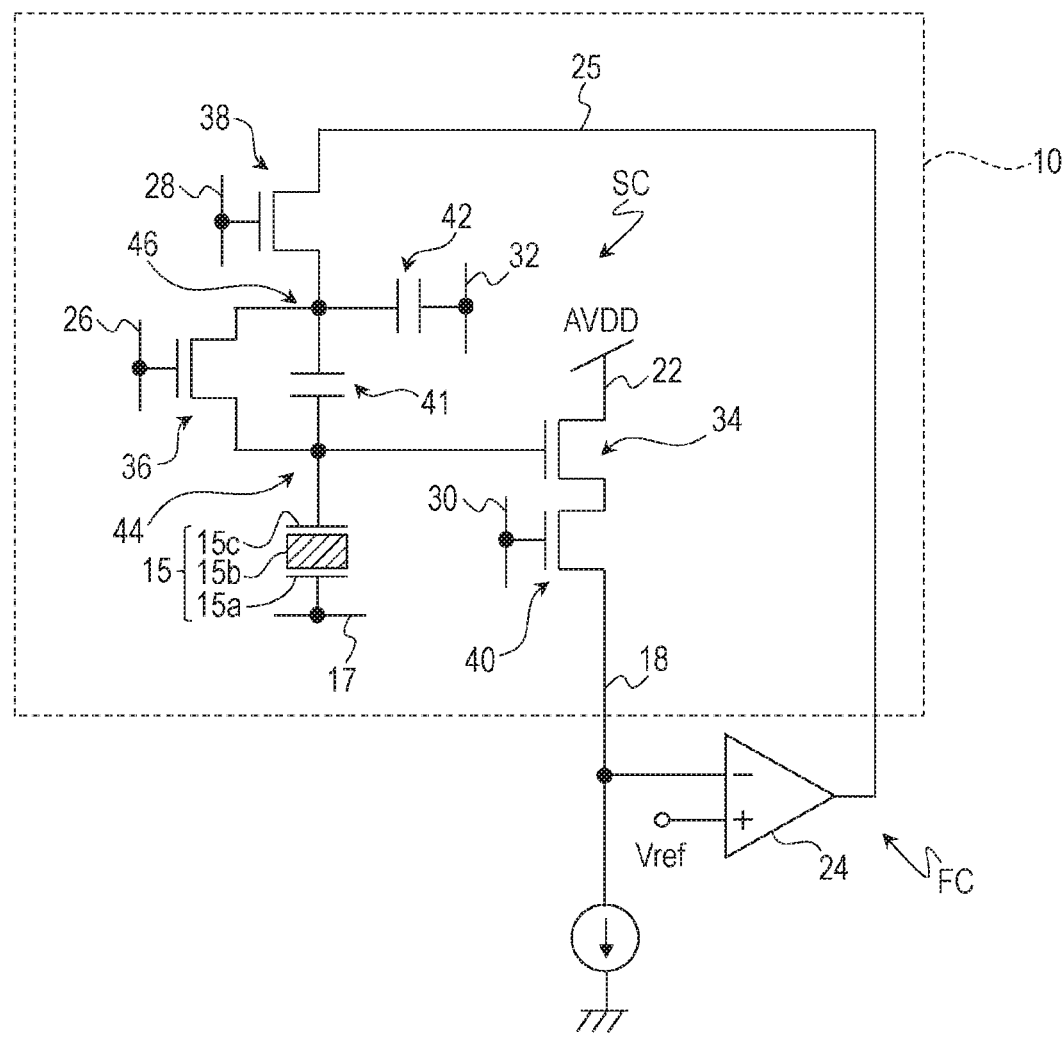
FIG. 2 is a schematic diagram that illustrates an exemplary circuit configuration of a unit pixel cell illustrated in FIG. 1.

FIG. 2 illustrates an exemplary circuit configuration of the unit pixel cell 10 illustrated in FIG. 1. The unit pixel cell 10 includes a photoelectric conversion unit 15 that photoelectrically converts incident light and a signal detection circuit SC that detects a signal generated by the photoelectric conversion unit.

The photoelectric conversion unit 15 typically has a structure in which a photoelectric conversion film 15b is interposed between a first electrode 15a and a second electrode (pixel electrode) 15c. As described below in detail with reference to the drawings, the photoelectric conversion unit 15 is laminated on the semiconductor substrate on which the unit pixel cell 10 is formed. The photoelectric conversion film 15b is formed of an organic material or an inorganic material such as amorphous silicon. The photoelectric conversion film 15b may include a layer configured with an organic material and a layer configured with an inorganic material.

The first electrode 15a is provided on the side of a light receiving surface of the photoelectric conversion film 15b. The first electrode 15a is formed of an electrically conductive material which is transparent such as Indium Tin Oxide (ITO). The second electrode 15c is provided on the side opposed to the first electrode 15a via the photoelectric conversion film 15b. The second electrode 15c collects charge generated through photoelectric conversion in the photoelectric conversion film 15b. The second electrode 15c is formed of metal such as aluminum or copper, a metal nitride, polysilicon which is doped with impurities to be electrically conductive, or the like.

As illustrated in FIG. 2, the first electrode 15a is connected with the storage control line 17, and the second electrode 15c is connected with a charge storage node (also referred to as "floating diffusion node") 44. The voltage of the first electrode 15a may be controlled via the storage control line 17, and either one of a hole or an electron that are generated through photoelectric conversion may thereby be collected by the second electrode 15c. In a case of using the hole as signal charge, the voltage of the first electrode 15a may be higher than that of the second electrode 15c. A case where the hole is used as the signal charge will be described below as an example. For example, a voltage of approximately 10 V is applied to the first electrode 15a via the storage control line 17. Accordingly, the signal charge is stored in the charge storage node 44. It is matter of course that an electron may be used as the signal charge.

The signal detection circuit SC of the unit pixel cell 10 includes an amplifier transistor 34, a reset transistor (first reset transistor) 36, a first capacitor 41, and a second capacitor 42. In the configuration illustrated in FIG. 2, the second capacitor 42 has a larger capacitance value than that of the first capacitor 41. In the configuration exemplified in FIG. 2, one of a source and a drain of the reset transistor 36 and one electrode of the first capacitor 41 are connected with the charge storage node 44. That is, those are electrically connected with the second electrode 15c. The other of the source and the drain of the reset transistor 36 and the other electrode of the first capacitor 41 are connected with one electrode of the second capacitor 42. In other words, the first capacitor 41 is connected between the source and the drain of the reset transistor 36. Accordingly, switching between ON and OFF at the reset transistor 36 makes it possible to switch whether to connect the second capacitor 42 with the charge storage node 44 via the reset transistor 36 or to connect the second capacitor 42 with the charge storage node 44 via the first capacitor 41. In the description made below, a node that includes a connection point between the first capacitor 41 and the second capacitor 42 may be referred to as a reset drain node 46.

The electrode of the second capacitor 42 that is not connected with the reset drain node 46 is connected with the sensitivity adjustment line 32. The voltage of the sensitivity adjustment line 32 is set to 0 V, for example. The voltage of the sensitivity adjustment line 32 does not have to be fixed while the imaging device 100 is in operation. For example, a pulse voltage may be supplied from the vertical scanning circuit 16 (see FIG. 1). As described below, the sensitivity adjustment line 32 may be used for controlling the voltage of the charge storage node 44. It is matter of course that the voltage of the sensitivity adjustment line 32 may be fixed while the imaging device 100 is in operation.

As illustrated in FIG. 2, a gate of the amplifier transistor 34 is connected with the charge storage node 44. In other words, the gate of the amplifier transistor 34 is electrically connected with the second electrode 15c. One of a source and a drain of the amplifier transistor 34 (which is the drain in N-channel MOS) is connected with the power supply wiring (source follower power supply) 22, and the other is connected with the vertical signal line 18 via an address transistor 40 described below. The source follower circuit is formed with the amplifier transistor 34 and the load circuit 19 (see FIG. 1). The amplifier transistor 34 amplifies the signal generated by the photoelectric conversion unit 15.

As illustrated in FIG. 2, the unit pixel cell 10 includes the address transistor (row selection transistor) 40. One of a source and a drain of the address transistor 40 is connected with the other of the source and the drain of the amplifier transistor 34. The other of the source and the drain of the address transistor 40 is connected with the vertical signal line 18. The gate of the address transistor 40 is connected with the address signal line 30. In the configuration exemplified in FIG. 2, the address transistor 40 configures a portion of the signal detection circuit SC.

The voltage in accordance with the signal charge stored in the charge storage node 44 is applied to the gate of the amplifier transistor 34. The amplifier transistor 34 amplifies this voltage. The voltage amplified by the amplifier transistor 34 is selectively read out as the signal voltage via the address transistor 40.

In the configuration exemplified in FIG. 2, the unit pixel cell 10 further includes a second reset transistor 38 one of a source and a drain of which is connected with the reset drain node 46 and the other of the source and the drain of which is connected with the feedback line 25. That is, in the configuration illustrated in FIG. 2, the other of the source and the drain of the reset transistor 36 is connected with the feedback line 25 via the second reset transistor 38. The gate of the second reset transistor 38 is connected with the feedback control line 28. The voltage of the feedback control line 28 is controlled to switch the second reset transistor 38 ON, and a feedback circuit that includes the charge storage node 44 and the second reset transistor 38 is thereby formed. That is, this enables the feedback circuit that negatively feeds back the output of the signal detection circuit SC to be formed. Formation of the feedback circuit is executed for one of the plural unit pixel cells 10 that share the feedback line 25.

The amplifier transistor 34, the first reset transistor 36, the address transistor 40, and the second reset transistor 38 may be N-channel MOS or P-channel MOS. All of those do not have to be standardized with N-channel MOS or P-channel MOS. A case where the amplifier transistor 34, the first reset transistor 36, the address transistor 40, and the second reset transistor 38 are N-channel MOS will be described below as an example. As the transistor, a bipolar transistor may be used other than a field effect transistor (FET).

(Device Structure of Unit Pixel Cell 10)

A device structure of the unit pixel cell 10 will next be described with reference to FIGS. 3 and 4.

Figure 3:
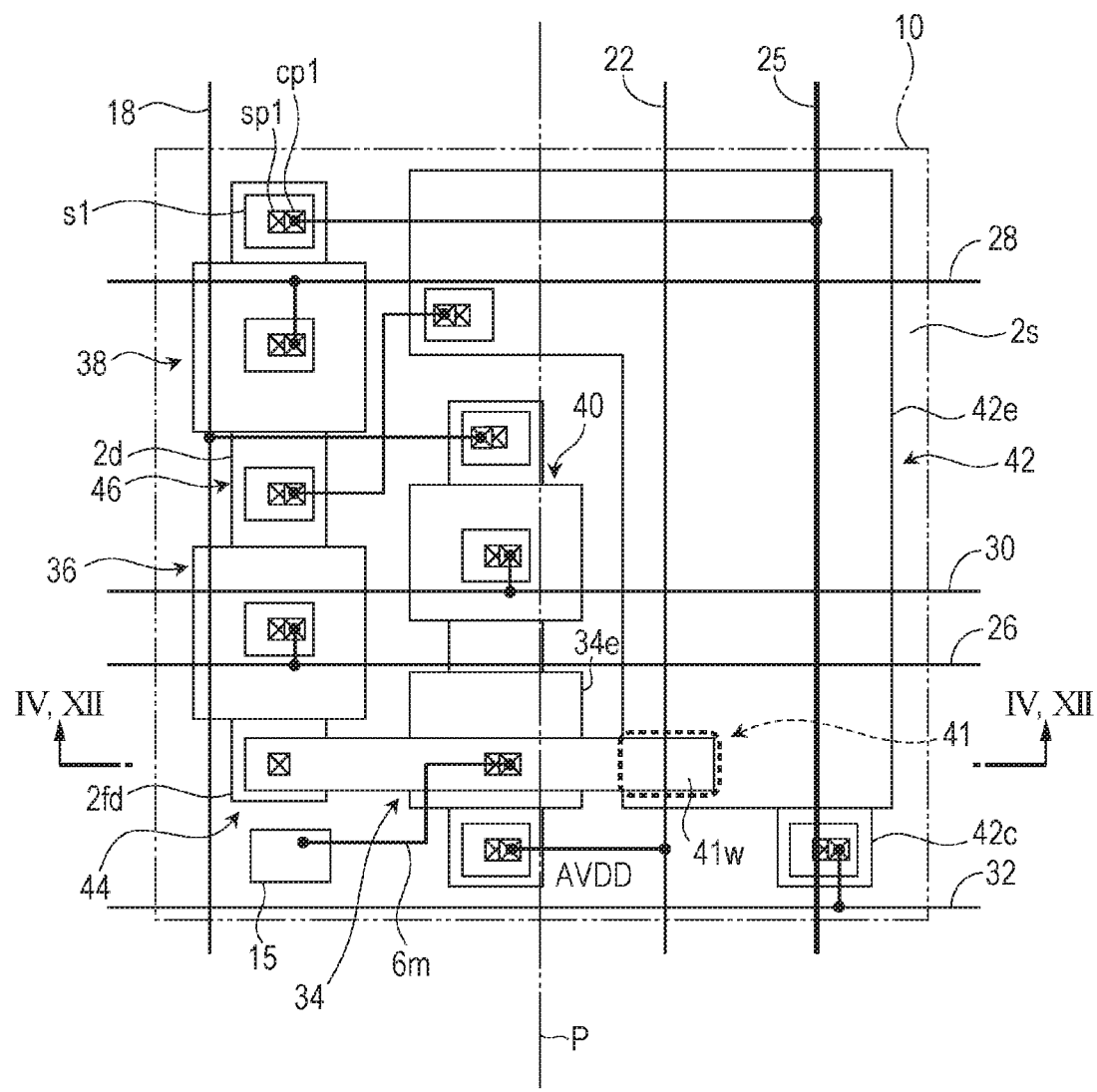
FIG. 3 is a plan view that schematically illustrates one example of a layout of elements and wiring in the unit pixel cell.

FIG. 3 schematically illustrates one example of a layout of elements and wiring in the unit pixel cell 10. FIG. 4 schematically illustrates the cross section taken along line IV-IV indicated in FIG. 3. As described above, the unit pixel cell 10 is disposed on the semiconductor substrate. Here, an example will be described where a p-type silicon (Si) substrate is used as a semiconductor substrate 2 (see FIG. 4).

In the configuration exemplified in FIG. 3, four transistors, that is, the amplifier transistor 34, the first reset transistor 36, the second reset transistor 38, and the address transistor 40 are arranged in the unit pixel cell 10. The unit pixel cells 10 are separated from each other by an element separating region 2s formed in the semiconductor substrate 2. In this example, the pair of the first reset transistor 36 and the second reset transistor 38 is separated from the pair of the amplifier transistor 34 and the address transistor 40 by the element separating region 2s.

Here, the amplifier transistor 34 and the first reset transistor 36 are together formed on the semiconductor substrate 2. Further, in the example described here, the second reset transistor 38 and the address transistor 40 are also formed on the semiconductor substrate 2. In this example, the first capacitor 41 and the second capacitor 42 are also formed on the semiconductor substrate 2. That is, here, the signal detection circuit SC is formed on the semiconductor substrate 2.

Focusing on the second reset transistor 38, the second reset transistor 38 includes impurity regions (here, n-type regions) 2d formed in the semiconductor substrate 2. The impurity regions 2d function as the source or the drain of the second reset transistor 38. The impurity region 2d is typically a diffusion layer formed in the semiconductor substrate 2. In the description made below, the impurity region 2d in the semiconductor substrate 2 may be referred to as "source/drain diffusion layer 2d".

In the configuration exemplified in FIG. 3, one of two source/drain diffusion layers 2d that configure the source and the drain of the second reset transistor 38 is connected with the feedback line 25 via a polysilicon plug sp1, a polysilicon layer s1, and a contact plug cp1. In the example illustrated in FIG. 3, the first reset transistor 36 and the second reset transistor 38 share one of the source/drain diffusion layers 2d.

In the configuration exemplified in FIG. 3, a gate electrode 34e of the amplifier transistor 34 is electrically connected with one of the source and the drain of the first reset transistor 36 via an upper electrode 41w. The upper electrode 41w is connected with the photoelectric conversion unit 15 via wiring 6m (typically metal wiring). In this example, the charge storage node 44 includes the wiring 6m, the upper electrode 41w, and the impurity region 2d that is the source or the drain of the first reset transistor 36 which is connected with the upper electrode 41w. In the description made below, the portion of the impurity region 2d that configures a portion of the charge storage node 44 (here, one of the source and the drain of the first reset transistor 36 which is connected with the upper electrode 41w) will be referred to as "charge storage region 2fd". The charge storage region 2fd has a function of storing charge (signal charge) generated in the photoelectric conversion unit 15.

As illustrated in FIG. 3, in the first embodiment, the charge storage region 2fd is not formed in the position that overlaps with the feedback line 25 when seen in the normal direction of the semiconductor substrate 2, that is, in plan view. Accordingly, the coupling capacitance between the charge storage region 2fd formed in the semiconductor substrate 2 and the feedback line 25 are reduced. This enables the influence of noise due to the coupling between the charge storage region 2fd and the feedback line 25 to be reduced. Further, the second capacitor 42 may be formed in the position that overlaps with the feedback line 25, and the coupling capacitance between the charge storage region 2fd and the feedback line 25 may thereby be further reduced.

As described below with reference to the drawings, in the first embodiment, the second capacitor 42 includes an electrode region 42c formed in the semiconductor substrate 2 and an upper electrode 42e that is opposed to at least a portion of the electrode region 42c via a dielectric layer 42g. As illustrated in FIG. 3, the second capacitor 42 occupies a relatively large area in the unit pixel cell 10. Accordingly, a relatively large capacitance value is realized. Further, here, at least a portion of the upper electrode 41w that electrically connects the source or the drain of the first reset transistor 36 (the charge storage region 2fd) with the gate electrode 34e of the amplifier transistor 34 extends to a portion above the upper electrode 42e. As described below, the dielectric layer 42g is arranged between the upper electrode 41w and the upper electrode 42e, and the first capacitor 41 is thereby formed. That is, in this embodiment, as illustrated in FIG. 3, the first capacitor 41 is formed in the position that overlaps with the second capacitor 42 when seen in the normal direction of the semiconductor substrate 2.

In the configuration exemplified in FIG. 3, the unit pixel cell 10 has two capacitors, which are the first capacitor 41 and the second capacitors 42. Here, when seen in the normal direction of the semiconductor substrate 2, the second capacitor 42 has the largest electrode area in the capacitors provided in the unit pixel cell 10. The unit pixel cell 10 may have three or more capacitors.

FIG. 3 has an imaginary center line P in parallel with the direction in which the feedback line 25 extends. In the first embodiment, when seen in the normal direction of the semiconductor substrate 2, the feedback line 25 is arranged on the opposite side from the charge storage region 2fd across the center line P in the unit pixel cell 10. In the example illustrated in FIG. 3, the feedback line 25 is located in the right region of the center line P in the unit pixel cell 10, and the charge storage region 2fd is located in the left region of the center line P. As described above, the charge storage region 2fd may be separately arranged from the feedback line 25 in the unit pixel cell 10, and crosstalk due to the coupling between the charge storage region 2fd and the feedback line 25 may thereby be prevented. Because the feedback line 25 transmits signals to which noise is added, crosstalk between the charge storage region 2fd and the feedback line 25 is suppressed, and the influence of noise may thereby be reduced. Herein, the unit pixel cell means a unit structure that outputs a signal (pixel value) in accordance with the amount of incident light. The unit pixel cell 10 is a unit structure that is obtained by equivalently dividing an imaging surface by the number of the charge storage nodes 44 (which may be considered as the number of pixels) and typically has a rectangular shape when seen in the normal direction of the semiconductor substrate 2. Accordingly, in this example, each of the unit pixel cells 10 has at least one second electrode 15c.

In addition, as illustrated in FIG. 3, in the unit pixel cell 10, the feedback line 25 may be arranged on the opposite side from the source/drain diffusion layer 2d that configures a portion of the reset drain node 46 across the center line P. That is, the feedback line 25 may be arranged in the position that does not overlap with the charge storage region 2fd or the impurity region 2d in the reset drain node 46 when seen in the normal direction of the semiconductor substrate 2. This enables the coupling between the impurity region 2d in the reset drain node 46 and the feedback line 25 to be suppressed and enables the influence of noise to be further reduced.

In the example illustrated in FIG. 3, the feedback line 25 is arranged in the position that overlaps with the capacitor which has the largest electrode area in the capacitors provided in the unit pixel cell 10 (here, the second capacitor 42) when seen in the normal direction of the semiconductor substrate 2. Such a configuration enables an electrode of the capacitor to function as a shield electrode. Accordingly, the coupling between the charge storage region 2fd and the feedback line 25 along the route that connects the charge storage region 2fd, the capacitor, and the feedback line 25 may thereby be suppressed.

The feedback line 25 may be arranged in the position that overlaps with the second capacitor 42, and the upper electrode 42e of the second capacitor 42 may thereby be formed between the feedback line 25 and the semiconductor substrate 2 throughout the portion of the feedback line 25 that is included in the unit pixel cell 10. As described below, the upper electrode 42e of the second capacitor 42 may be caused to function as a shield electrode. In view of reduction in the coupling capacitance, it is beneficial to form the upper electrode 42e such that the upper electrode 42e overlaps with whole the portion of the feedback line 25 that is included in the unit pixel cell 10.

Figure 4:
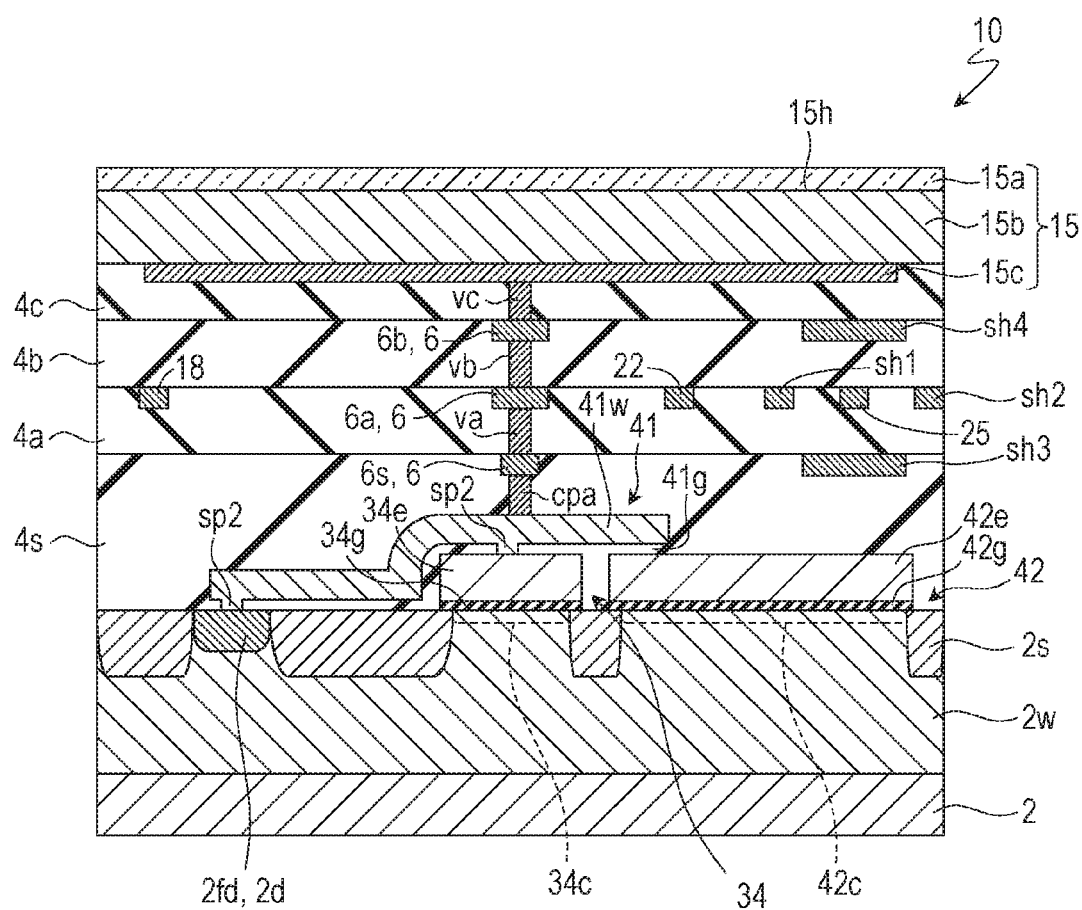
FIG. 4 is a cross-sectional view that schematically illustrates the cross section taken along line IV-IV indicated in FIG. 3.

FIG. 4 will be referred to. As illustrated in FIG. 4, the unit pixel cell 10 has the photoelectric conversion unit 15 on the semiconductor substrate 2. In the example illustrated in FIG. 4, interlayer insulating layers 4s, 4a, 4b, and 4c that are formed of silicon dioxide (SiO$_2$), for example, are laminated on the semiconductor substrate 2. Further, a wiring layer 6 is arranged between the semiconductor substrate 2 and the photoelectric conversion unit 15. In the configuration exemplified in FIG. 4, the wiring layer 6 has a multilayer wiring structure that includes a wiring layer 6s formed in the interlayer insulating layer 4s, a wiring layer 6a formed in the interlayer insulating layer 4a, and a wiring layer 6b formed in the interlayer insulating layer 4b. The wiring that extends in the row direction such as the above-described reset signal line 26 and feedback control line 28 (see FIG. 3) may be in the same layer as the wiring layer 6s. Two wiring layers are electrically connected together by a via va or vb. The numbers of the wiring layers and the interlayer insulating layers may arbitrarily be set and are not limited to the illustrated example.

In the configuration exemplified in FIG. 4, the photoelectric conversion unit 15 that includes the photoelectric conversion film 15b is laminated on the interlayer insulating layer 4c. The first electrode 15a is provided on a light receiving surface 15h on the side, on which light from an object is incident, in the photoelectric conversion film 15b. The second electrode 15c is arranged on the surface on the opposite side from the light receiving surface 15h. The second electrode 15c is spatially separated and is thereby electrically separated among the plural unit pixel cells 10.

In the configuration exemplified in FIG. 4, the feedback line 25 is a portion of the wiring layer 6. In other words, the wiring layer 6 that is arranged between the semiconductor substrate 2 and the photoelectric conversion unit 15 includes at least a portion of the feedback line 25 in the unit pixel cell 10. The feedback line 25 extends over the plural unit pixel cells 10 and configures a portion of a feedback circuit FC (see FIG. 2). Here, the feedback line 25 is in the same layer as the wiring layer 6a. As described above, in a case where the feedback line 25 is provided in the wiring layer other than the lowest layer (here, the wiring layer 6s) among the plural wiring layers included in the multilayer wiring structure, the distance between the charge storage region 2fd and the feedback line 25 may be made large. Thus, the coupling between the charge storage region 2fd and the feedback line 25 may more effectively be suppressed. Herein, "lowest layer" means the closest layer to the semiconductor substrate 2 in two or more wiring layers.

In the configuration exemplified in FIG. 4, shield electrodes sh1 and sh2 that are in the same layer as the wiring layer 6a are arranged on the left and right of the feedback line 25. As described above, the shield electrodes (shield wiring) may be arranged around the feedback line 25. The shield electrodes are arranged around the feedback line 25, and the coupling between the charge storage region 2fd and the feedback line 25 may thereby be further reduced. In the unit pixel cell 10, the shield electrode sh1 is arranged between the power supply wiring 22 and the feedback line 25, and the shield electrode sh2 is arranged between the feedback line 25 and the vertical signal line 18 of the adjacent unit pixel cell 10. The shield electrodes are electrically connected with the vertical scanning circuit 16 (see FIG. 1) or a power supply circuit which is not illustrated, for example, and are thereby configured to be capable of supplying a constant voltage. Herein, "shield electrode" means an electrode or wiring to which a constant voltage is supplied during an operation.

Further, as illustrated in FIG. 4, the shield electrode may be arranged in a lower layer than the feedback line 25. In the configuration exemplified in FIG. 4, a shield electrode sh3 is arranged between the feedback line 25 and the semiconductor substrate 2. The shield electrode sh3 is arranged in the position that overlaps with at least a portion of the feedback line 25 when seen in the normal direction of the semiconductor substrate 2. The shield electrode sh3 whose voltage is fixed may be provided in the position that overlaps with the feedback line 25, and the coupling between the charge storage region 2fd and the feedback line 25 may thereby be more effectively suppressed. Herein, the terms "lower layer" and "higher layer" are used to indicate relative arrangement of members and are not intended to limit the position of the imaging device of the present disclosure. The same applies to the terms "upper" and "lower" used herein.

In the configuration exemplified in FIG. 4, a shield electrode is also arranged in a higher layer than the feedback line 25. That is, in the example illustrated in FIG. 4, a shield electrode sh4 is arranged between the feedback line 25 and the second electrode 15c. Similarly to the shield electrode sh3, the shield electrode sh4 is arranged in the position that overlaps with at least a portion of the feedback line 25 when seen in the normal direction of the semiconductor substrate 2. The shield electrode sh4 may be arranged between the feedback line 25 and the second electrode 15c, and crosstalk due to the coupling between the second electrode 15c and the feedback line 25 may thereby be suppressed. Thus, the influence of noise may further be reduced.

The shield electrode does not have to be formed. In a case where the shield electrode is not formed, restriction on design is low, thus resulting in an advantage of facilitating formation of finer pixels. Further, a metal electrode or metal wiring is not arranged around the feedback line 25, the coupling capacitance between the feedback line 25 and the metal electrode or metal wiring is thereby reduced, and delay of signals may thus be prevented. In the laminated type imaging device, as understood by referring to FIG. 3, various kinds of control wiring may be formed in plural layers of the multilayer wiring structure. Thus, the shield electrode may not be arranged in a desired location in a higher layer and/or a lower layer than the feedback line 25. Even in such a case, in the embodiment of the present disclosure, the feedback line 25 is arranged in a position separated from the charge storage region 2fd, and the influence of noise due to the coupling between those may thus be suppressed.

In the configuration exemplified in FIG. 4, the semiconductor substrate 2 has a well 2w (here, p-type region) that has a relatively high acceptor concentration and the impurity region 2d (here, n-type region). As illustrated in FIG. 4, the impurity region 2d as the charge storage region 2fd is electrically connected with the upper electrode 41w via a polysilicon plug sp2. Here, the charge storage region 2fd is one of the source and the drain of the first reset transistor 36 (see FIG. 3). A plug formed of polysilicon may be used as a contact to the charge storage region 2fd, and the influence of crystal defects due to the interface between metal and semiconductor in a case of using a metal plug may thereby be avoided. Thus, an advantage of reducing dark current may be obtained. In the configuration exemplified in FIG. 4, the upper electrode 41w is electrically connected with the gate electrode 34e of the amplifier transistor 34 via the polysilicon plug sp2. In this embodiment, the upper electrode 41w that configures a portion of the first capacitor 41 is a portion of the wiring (electrically-conductive layer) that electrically connects the source or the drain (the source/drain diffusion layer 2d) of the first reset transistor 36 with the gate electrode 34e of the amplifier transistor 34.

The amplifier transistor 34 includes two source/drain diffusion layers 2d, a gate insulating film 34g (typically a silicon dioxide film) formed on the semiconductor substrate 2, and the gate electrode 34e formed on the gate insulating film 34g. Here, the gate electrode 34e is an electrode formed of polysilicon. FIG. 4 does not illustrate the two source/drain diffusion layers 2d in the amplifier transistor 34 but illustrates the gate insulating film 34g, the gate electrode 34e, and a channel region 34c formed between the two source/drain diffusion layers 2d. The channel region 34c may be a region in which ion implantation of acceptors or donors is performed under a prescribed implantation condition. A desired threshold voltage may be realized by ion implantation. The first reset transistor 36, the second reset transistor 38, and the address transistor 40 (see FIG. 3) may have a substantially similar configuration to the amplifier transistor 34.

In this embodiment, the semiconductor substrate 2 has the electrode region 42c. The electrode region 42c is surrounded by the element separating region 2s and is thereby electrically separated from the four transistors (the amplifier transistor 34, the first reset transistor 36, the second reset transistor 38, and the address transistor 40) of the unit pixel cell 10. The electrode region 42c may be a region that has a higher impurity concentration than the portion corresponding to the well 2w by ion implantation, for example. Alternatively, the electrode region 42c may be a region of a conductivity type that is different from the conductivity type of the well 2w. Here, the electrode region 42c is a region that is formed by using a resist mask which has an opening in a prescribed region of the semiconductor substrate 2 and performing ion implantation of donors (for example, arsenic (As)) in a prescribed region of the semiconductor substrate 2.

As illustrated in FIG. 4, the second capacitor 42 includes a dielectric layer (first dielectric layer) 42g provided on the electrode region 42c and the upper electrode 42e that is opposed to a portion of the semiconductor substrate 2 via the dielectric layer 42g. The dielectric layer 42g is typically formed of silicon dioxide. The upper electrode 42e is electrically connected with one of the source and the drain of the first reset transistor 36, which is not connected with the charge storage node 44.

In the configuration exemplified in FIG. 4, the second capacitor 42 is a so-called MIS capacitor. That is, in this example, a portion of the semiconductor substrate 2 that is opposed to the upper electrode 42e functions as one of the electrodes in the second capacitor 42. Here, the upper electrode 42e of the second capacitor 42 is not an electrode formed of metal but is an electrode formed of polysilicon. Thus, patterning may be executed by depositing a silicon dioxide film and a polysilicon film on the semiconductor substrate 2, and the dielectric layer 42g and the upper electrode 42e of the second capacitor 42 may thereby be formed simultaneously with formation of the gate insulating films and the gate electrodes of the four transistors including the amplifier transistor 34. As described above, the second capacitor 42 may be formed in the unit pixel cell 10 without increasing steps. The second capacitor 42 may be formed as a so-called MIS capacitor, and the dynamic range may thereby be expanded by a simple configuration while suppressing an increase in the number of elements in the pixel.

The electrode region 42c is electrically connected with the sensitivity adjustment line 32 (see FIG. 2). A prescribed voltage is applied from a voltage source (here, the vertical scanning circuit 16) to the electrode region 42c via the sensitivity adjustment line 32. The voltage of the electrode region 42c may be controlled, and the voltage of the charge storage node 44 may thereby be controlled. In other words, the voltage supplied to the electrode region 42c may be adjusted via the sensitivity adjustment line 32, and the sensitivity of the imaging device 100 may thereby be adjusted. Further, a constant voltage may be supplied to the electrode region 42c, and the voltage of the upper electrode 42e may thereby be maintained at a certain voltage. This enables the upper electrode 42e of the second capacitor 42 that has a relatively large capacitance value to be caused to function as a shield electrode. The upper electrode 42e of the second capacitor 42 may be caused to function as a shield electrode, and the coupling capacitance between the charge storage region 2fd and the feedback line 25 may thereby be further reduced.

The shape and area of the dielectric layer 42g do not have to match with the shape and area of the electrode region 42c when seen in the normal line direction of the semiconductor substrate 2. The dielectric layer 42g does not have to cover whole the electrode region 42c. The dielectric layer 42g may be formed on the element separating region 2s that surrounds the electrode region 42c.

In the configuration exemplified in FIG. 4, the upper electrode 41w is electrically connected with the second electrode 15c via a contact plug cpa, the wiring layer 6s, the via va, the wiring layer 6a, the via vb, the wiring layer 6b, and a via vc. In this example, the wiring 6m (see FIG. 3) is formed with the contact plug cpa, the wiring layer 6s, the via va, the wiring layer 6a, the via vb, and the wiring layer 6b, and a via vc. The contact plug cpa, the wiring layers 6s, 6a, and 6b, and the vias va to vc are typically formed of metal such as copper. The polysilicon plug sp2, the upper electrode 41w, the contact plug cpa, the wiring layers 6s, 6a, and 6b, the vias va to vc, and one of the source and the drain (here, the drain) of the first reset transistor 36 have a function of storing charge generated in the photoelectric conversion unit 15.

As illustrated in FIG. 4, the contact plug cpa is formed between the wiring layer 6s located in the lowest layer of the multilayer wiring structure of the wiring layer 6 and the upper electrode 41w and electrically connects the wiring layer 6s and the upper electrode 41w together. The contact plug cpa physically contacts with the wiring layer 6s and the upper electrode 41w therebetween. FIG. 4 schematically illustrates the cross section of the unit pixel cell 10 in a case where the unit pixel cell 10 is sectioned along the cross section that is perpendicular to the direction in which the feedback line 25 extends and includes the contact plug cpa. As illustrated in FIG. 4, here, the feedback line 25 is arranged above a region of the semiconductor substrate 2 that is located on the opposite side from the charge storage region 2fd across the contact plug cpa. Further, the feedback line 25 is arranged in a closer position to the second electrode 15c than the contact plug cpa. The feedback line 25 may be arranged such that the feedback line 25 and the charge storage region 2fd are in point symmetry with respect to the contact plug cpa. As described above, the feedback line 25 may be arranged two-dimensionally and three-dimensionally separately from the charge storage region 2fd, and crosstalk due to the coupling between the charge storage region 2fd and the feedback line 25 may thereby be further reduced.

In the configuration exemplified in FIG. 4, the upper electrode 41w extends to a portion above the upper electrode 42e of the second capacitor 42. The first capacitor 41 is formed with the upper electrode 41w, the upper electrode 42e, and an insulating film (second dielectric layer) 41g interposed between the upper electrode 41w and the upper electrode 42e. In other words, the first capacitor 41 includes the upper electrode 42e of the second capacitor 42, the dielectric layer 41g formed on the upper electrode 42e, and the upper electrode 41w connected with the second electrode 15c of the photoelectric conversion unit 15. The dielectric layer 41g may be a portion of the interlayer insulating layer 4s. At least a portion of the upper electrode 41w of the first capacitor 41 overlaps with the upper electrode 42e via the dielectric layer 41g when seen in the normal direction of the semiconductor substrate 2.

In this example, the first capacitor 41 and the second capacitor 42 share one of two electrodes for forming a capacitor. The dielectric layer 41g may be a portion of the interlayer insulating layer 4s. As described above, the dielectric layer 41g may be a portion of the interlayer insulating layer formed on the semiconductor substrate 2 or may be a separate insulating film (or insulating layer) that is different from the interlayer insulating layer.

Here, the upper electrode 41w of the first capacitor 41 is formed of polysilicon, similarly to the upper electrode 42e of the second capacitor 42. The CV curve of a capacitor that has a structure in which a dielectric layer is interposed between two electrodes formed of polysilicon has a flat portion in a relatively wide voltage range. The voltage between the electrodes of the first capacitor 41 exhibits a relatively large fluctuation in response to the change in the voltage of the charge storage node 44 in accordance with the amount of light. It is beneficial to form the two electrodes, which configure the first capacitor 41, of polysilicon because an increase in the element size may be suppressed and a highly accurate capacitor that has a flat CV characteristic may also be realized. Further, in this case, the upper electrode 41w is a portion of a conductive portion that connects the charge storage region 2fd with the gate electrode 34e of the amplifier transistor 34. Accordingly, patterning may be executed such that at least a portion of the conductive portion (here, the polysilicon layer) overlaps with the upper electrode 42e of the second capacitor 42 via the dielectric layer 41g, and the first capacitor 41 may thereby be formed together with formation of the conductive portion that connects the charge storage region 2fd with the gate electrode 34e of the amplifier transistor 34. As described above, the first capacitor 41 may be formed in the unit pixel cell 10 without increasing steps.

In the circuit configuration exemplified in FIG. 2, the unit pixel cells 10 in each row are selected as a unit, and a noise cancelling operation is executed. That is, noise cancelling is typically performed for one unit pixel cell 10 that is sequentially selected from the plural unit pixel cells 10 aligned in the column direction. However, the method of noise cancelling is not limited to this example. For example, plural feedback lines may be arranged for each column of the unit pixel cells 10, and noise cancelling may thereby be executed for two or more selected rows. Such configuration enables noise cancelling to be completed more quickly. For example, two feedback lines may be arranged for each column of the unit pixel cells 10, one of the feedback lines may be connected with unit pixel cells 10 of the odd rows, and the other may be connected with the unit pixel cells 10 of the even rows, and a noise cancelling operation for two rows as a unit may thereby be realized. As described above, the number of the feedback lines 25 in the unit pixel cells 10 is not limited to one.

A modification example of the imaging device according to the first embodiment of the present disclosure will next be described with reference to FIGS. 5 to 7.

Figure 5:
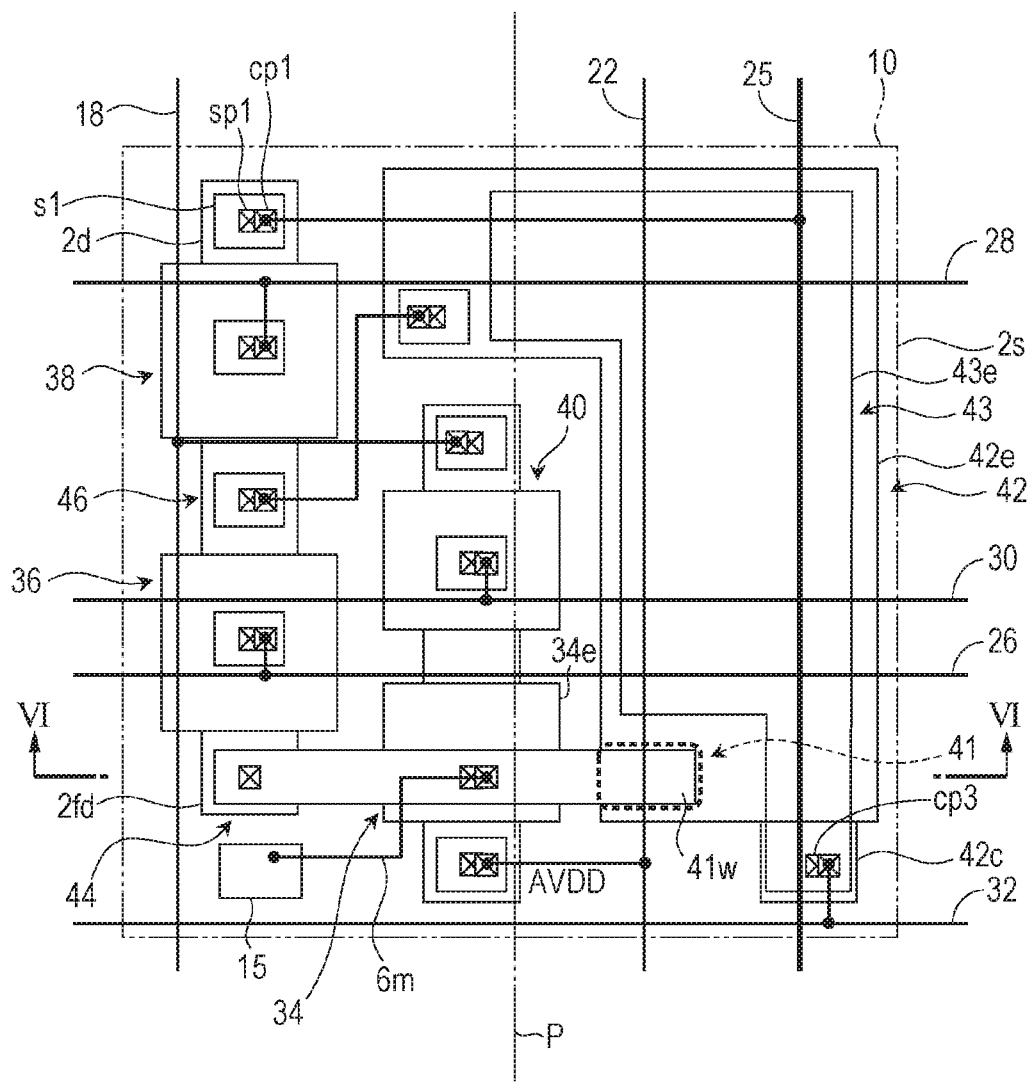
FIG. 5 is a plan view that schematically illustrates another example of the layout of the elements in the unit pixel cell.

FIG. 5 schematically illustrates another example of the layout of elements in the unit pixel cell 10. FIG. 6 schematically illustrates the cross section taken along line VI-VI indicated in FIG. 5. The difference between the configuration exemplified in FIGS. 5 and 6 and the configuration described with reference to FIGS. 3 and 4 is the point that the unit pixel cell 10 illustrated in FIGS. 5 and 6 further has a third capacitor 43.

As illustrated in FIG. 5, the third capacitor 43 includes an upper electrode 43e that is arranged on the upper electrode 42e of the second capacitor 42. As illustrated in FIG. 5, the upper electrode 43e overlaps with the upper electrode 42e of the second capacitor 42 when seen in the normal direction of the semiconductor substrate 2. Further, in the configuration exemplified in FIG. 5, the upper electrode 43e is electrically connected with the electrode region 42c of the semiconductor substrate 2, which configures a portion of the second capacitor 42, via a contact plug cp3. Similarly to the configuration described with reference to FIG. 3, in this example also, the electrode region 42c is electrically connected with the sensitivity adjustment line 32. Accordingly, a desired voltage may be applied from the vertical scanning circuit 16 (see FIG. 1), for example, to the electrode region 42c and the upper electrode 43e via the sensitivity adjustment line 32.

Figure 6:
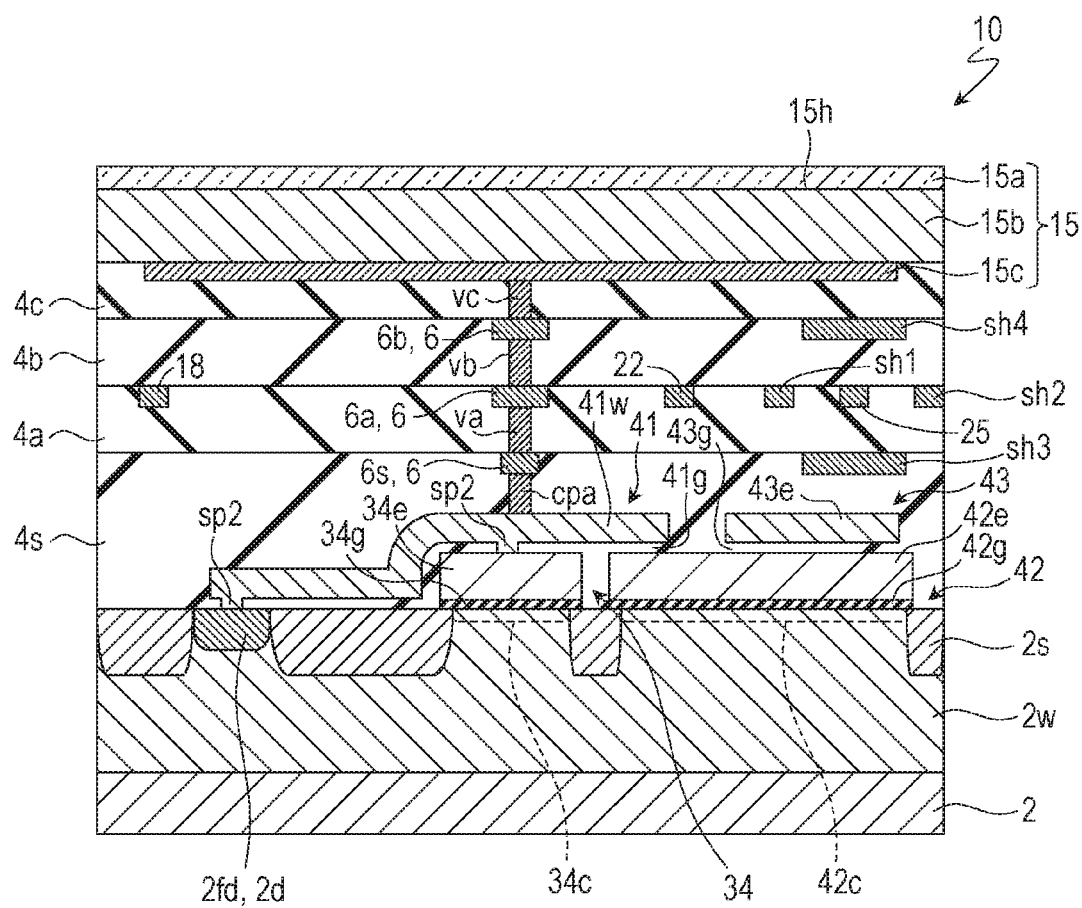
FIG. 6 is a cross-sectional view that schematically illustrates the cross section taken along line VI-VI indicated in FIG. 5.

As illustrated in FIG. 6, the upper electrode 43e of the third capacitor 43 is opposed to the upper electrode 42e of the second capacitor 42 via a dielectric layer 43g that is formed on the upper electrode 42e of the second capacitor 42. That is, the third capacitor 43 and the second capacitor 42 share one of two electrodes for forming a capacitor and are connected together electrically in parallel. Accordingly, the capacitance value of the capacitor that is connected between the reset drain node 46 and the sensitivity adjustment line 32 may be increased (see FIG. 2). This enables kTC noise to be more effectively decreased. The dielectric layer 43g of the third capacitor 43 may be a portion of the interlayer insulating layer 4s, similarly to the dielectric layer 41g of the first capacitor 41.

The upper electrode 43e of the third capacitor 43 is typically formed of polysilicon. The upper electrode 43e may be formed simultaneously with formation of the upper electrode 41w by patterning a polysilicon film for forming the upper electrode 41w of the first capacitor 41. As described above, the third capacitor 43 that exhibits a flat CV characteristic in a relatively wide voltage range may be formed in the unit pixel cell 10 without adding dedicated steps. Further, the combined capacitance of the second capacitor 42 and the third capacitor 43 may be increased while expansion of the pixel size is suppressed.

In the configuration exemplified in FIG. 6, similarly to the configuration described with reference to FIG. 4, the shield electrode sh3 is arranged between the feedback line 25 and the semiconductor substrate 2. As described above, the wiring that extends in the row direction such as the reset signal line 26 and feedback control line 28 (see FIG. 3) may be in the same layer as the wiring layer 6s. In this case, in order to avoid physical interference with the wiring that extends in the row direction, the shield electrode sh3 in the same layer as the wiring layer 6s may not be formed in a whole portion in the direction in which the feedback line 25 extends.

In the configuration illustrated in FIG. 6, the upper electrode 43e is arranged in a lower layer than the shield electrode sh3. Physical interference with the wiring that extends in the row direction does not have to be taken into consideration about the upper electrode 43e. Thus, the upper electrode 43e may be formed in the whole portion in the direction in which the feedback line 25 extends. Further, here, a constant voltage may be applied to the upper electrode 43e via the sensitivity adjustment line 32 while the imaging device 100 is operating. That is, the upper electrode 43e may be caused to function as a shield electrode. Accordingly, crosstalk due to the coupling between the charge storage region 2fd and the feedback line 25 may be further reduced compared to a case where the third capacitor 43 is not formed in the unit pixel cell 10. This enables the influence of noise to be further reduced.

Figure 7:
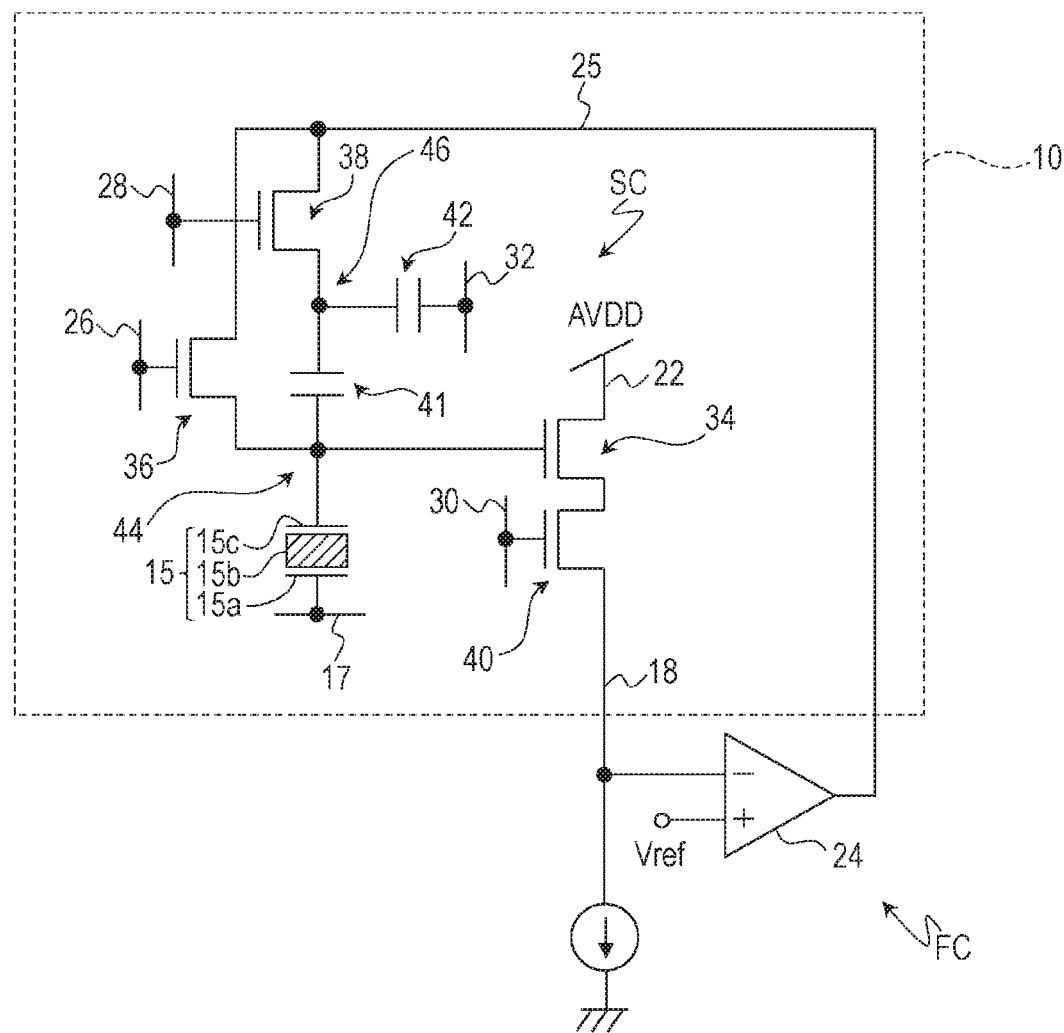
FIG. 7 is a schematic diagram that illustrates another exemplary circuit configuration of the unit pixel cell.

FIG. 7 schematically illustrates another exemplary circuit configuration of the unit pixel cell 10.

The difference between the configuration exemplified in FIG. 7 and the configuration exemplified in FIG. 2 is the point that one of the source and the drain of the first reset transistor 36, which is not connected with the charge storage node 44, is connected with not the reset drain node 46 but the feedback line 25.

In the configuration illustrated in FIG. 7, one of the source and the drain of the first reset transistor 36, which is not connected with the charge storage node 44, is directly connected with the feedback line 25. This results in an advantage of improving flexibility in the design of the impurity profile for securing driving power of the first reset transistor 36.

The layout of elements and the device structure in the unit pixel cell 10 illustrated in FIG. 7 are almost the same as the layout described with reference to FIGS. 3 and 5 and the device structure described with reference to FIGS. 4 and 6, and a description thereof will thus be omitted. The unit pixel cells 10 illustrated in FIGS. 5, 6, and 7 may be manufactured by the same method as the unit pixel cell 10 illustrated in FIGS. 2 to 4.

Second Embodiment

Figure 8:
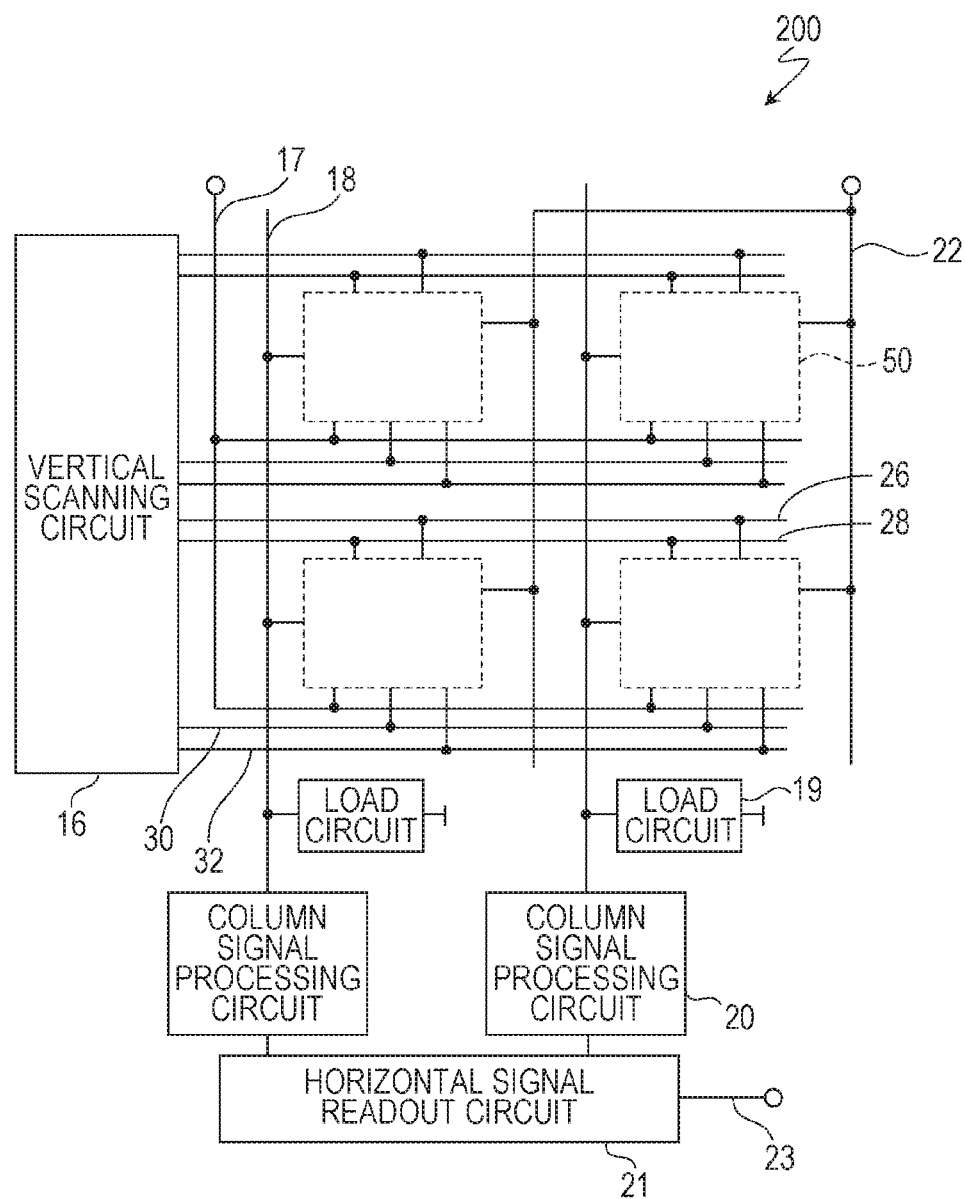
FIG. 8 is a schematic diagram that illustrates an exemplary circuit configuration of an imaging device according to a second embodiment.
Figure 9:
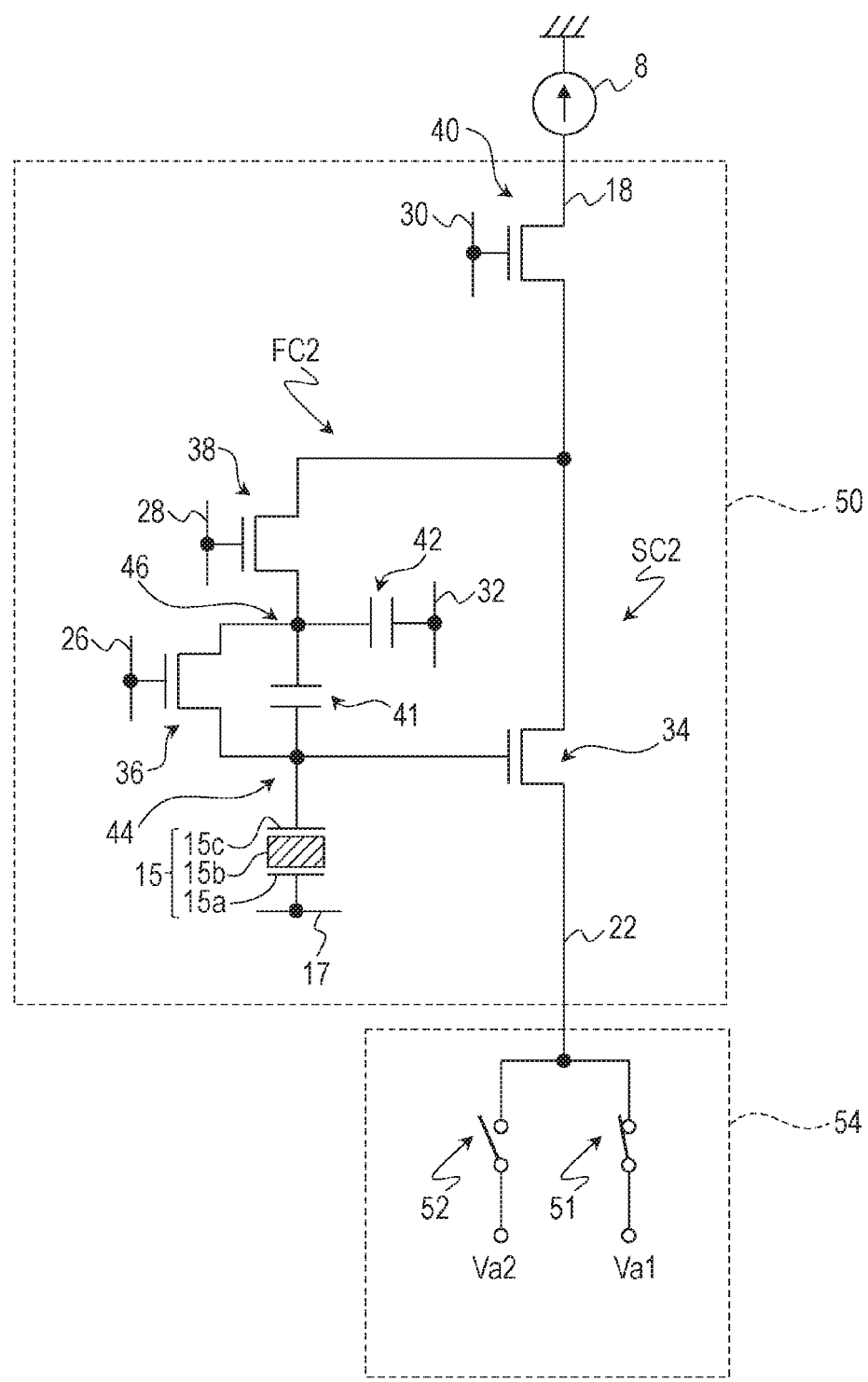
FIG. 9 is a schematic diagram that illustrates an exemplary circuit configuration of a unit pixel cell of the imaging device illustrated in FIG. 8.

FIG. 8 schematically illustrates an exemplary circuit configuration of an imaging device according to a second embodiment. FIG. 9 schematically illustrates an exemplary circuit configuration of a unit pixel cell 50 of an imaging device 200 illustrated in FIG. 8. The difference between the second embodiment and the first embodiment is the point that each of the unit pixel cells 50 includes a signal detection circuit SC2 that has a feedback circuit FC2. The descriptions common to the first embodiment will not be repeated below.

As illustrated in FIG. 9, the unit pixel cell 50 of the imaging device 200 according to the second embodiment includes the signal detection circuit SC2 that has the feedback circuit FC2. The signal detection circuit SC2 includes the amplifier transistor 34. The gate of the amplifier transistor 34 is connected with the second electrode 15c of the photoelectric conversion unit 15 via a wiring layer which is not illustrated (see FIG. 11 which will be described below). One of the source and the drain of the amplifier transistor 34 is connected with the power supply wiring 22, and the other is connected with the address transistor 40 and the vertical signal line 18. The vertical signal line 18 is a signal line for reading out signals of the signal detection circuit SC2. The vertical signal line 18 is typically an output line of the signal detection circuit SC2. Here, the vertical signal line 18 is connected with one of the source and the drain of the first reset transistor 36, which is not connected with the second electrode 15c, via the second reset transistor 38.

As illustrated in FIG. 9, in the second embodiment, one of the source and the drain of the second reset transistor 38, which is not connected with the reset drain node 46, is connected with one of the source and the drain of the amplifier transistor 34, which is not connected with the power supply wiring 22. That is, the feedback circuit FC2 forms a feedback loop that negatively feeds back the output of the amplifier transistor 34. In other words, in the second embodiment, the signal generated by the photoelectric conversion unit 15 is fed back via the amplifier transistor 34. In the configuration exemplified in FIG. 9, the output of the amplifier transistor 34 is used as a reference voltage at resetting.

In the second embodiment, feedback for noise cancelling may be executed in each of the unit pixel cells 50. Accordingly, noise cancelling may quickly be executed without being influenced by the time constant of the vertical signal line 18. In the circuit configuration exemplified in FIG. 9, the voltage (output voltage) of the source or the drain of the amplifier transistor 34 is applied to the first reset transistor 36. Such a configuration enables the change in the voltage of the charge storage node 44 around the time when the first reset transistor 36 is switched OFF and thus enables quicker noise suppression to be realized.

In the configuration illustrated in FIG. 9, the power supply wiring 22 is connected with a voltage switching circuit 54. The voltage switching circuit 54 has the pair of a first switch 51 and a second switch 52. The voltage switching circuit 54 switches voltage supply to the power supply wiring 22 between a first voltage Va1 and a second voltage Va2. The first voltage Va1 is 0 V (ground), for example. The second voltage Va2 is the power supply voltage, for example. The voltage switching circuit 54 may be provided to each pixel or may be shared by plural pixels. Such a circuit configuration also enables the influence of kTC noise to be decreased, similarly to the first embodiment.

In the second embodiment, the inverting amplifier 24 (see FIGS. 2 and 7) is omitted. In the second embodiment, noise cancelling is executed for each of the unit pixel cells 50. In such a configuration, noise that enters the vertical signal line 18 which is the output line of the signal detection circuit SC2 is likely to influence the voltage of the charge storage region 2fd. Accordingly, it is beneficial to suppress the coupling between the charge storage region 2fd and the vertical signal line 18.

Figure 10:
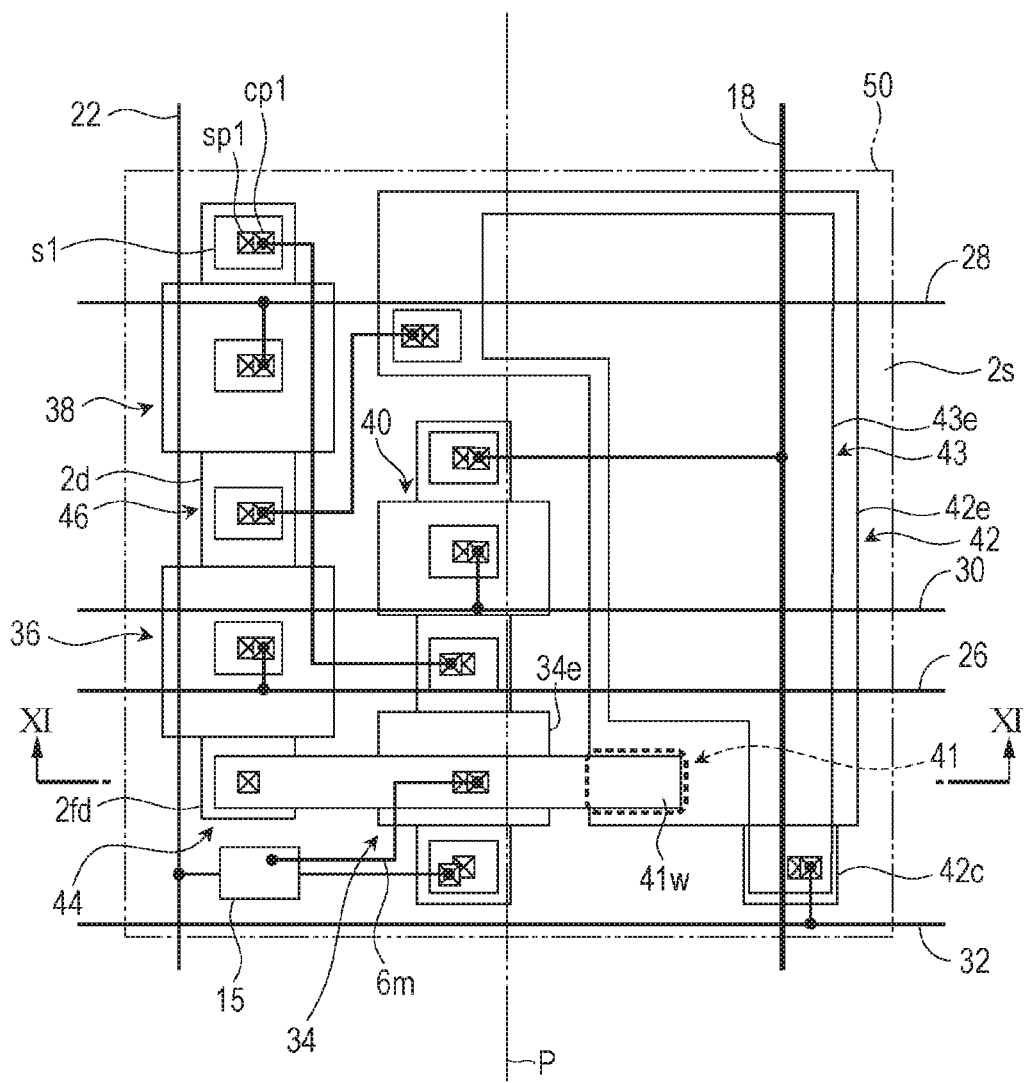
FIG. 10 is a plan view that schematically illustrates one example of the layout of elements and wiring in the unit pixel cell.

FIG. 10 schematically illustrates one example of the layout of elements and wiring in the unit pixel cell 50. As illustrated in FIG. 10, when seen in the normal direction of the semiconductor substrate 2, the vertical signal line 18 that is the output line of the signal detection circuit SC2 is arranged on the opposite side from the charge storage region 2fd across the center line P in the unit pixel cell 50. That is, the charge storage region 2fd is not arranged under the vertical signal line 18. This enables crosstalk due to the coupling between the charge storage region 2fd and the vertical signal line 18 to be prevented and enables the influence of noise to be reduced.

Further, as illustrated in FIG. 10, in the unit pixel cell 50, the vertical signal line 18 may be arranged on the opposite side from the source/drain diffusion layer 2d that configures a portion of the reset drain node 46 across the center line P. This enables the coupling between the impurity region 2d in the reset drain node 46 and the vertical signal line 18 to be suppressed and enables the influence of noise to be further reduced. In the example illustrated in FIG. 10, the vertical signal line 18 is arranged in the position that overlaps with the second capacitor 42 which has the largest electrode area in the unit pixel cell 50. This enables the coupling between the charge storage region 2fd and the vertical signal line 18 to be further suppressed.

In the configuration exemplified in FIGS. 9 and 10, there is no feedback line that extends through the plural unit pixel cells. Thus, the influence of signal delay in the feedback line does not have to be taken into consideration.

Figure 11:
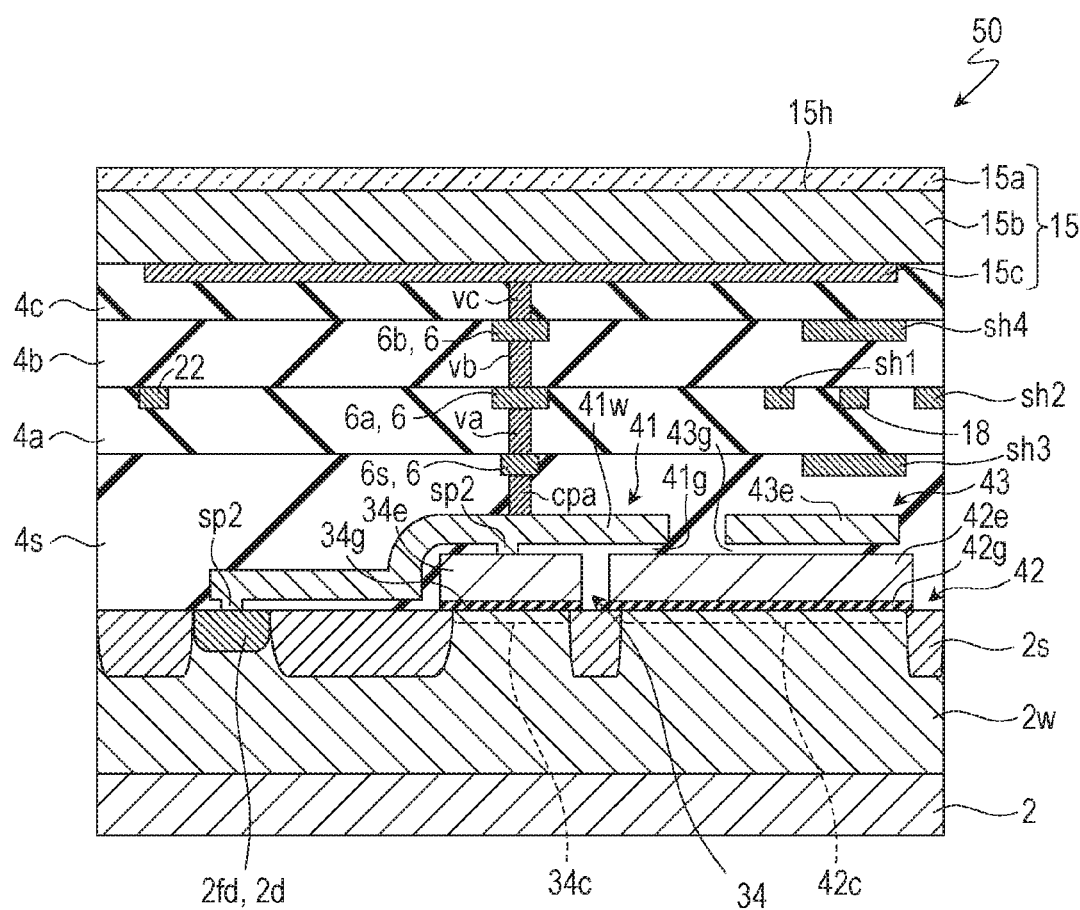
FIG. 11 is a cross-sectional view that schematically illustrates the cross section taken along line XI-XI indicated in FIG. 10.

FIG. 11 schematically illustrates the cross section taken along line XI-XI indicated in FIG. 10. In this example, the vertical signal line 18 is a portion of the wiring layer 6 that connects the gate of the amplifier transistor 34 with the second electrode 15c of the photoelectric conversion unit 15. That is, the wiring layer 6 may include at least a portion of the vertical signal line 18 in the unit pixel cell 50. In the configuration exemplified in FIG. 11, the vertical signal line 18 is a portion of a wiring layer (here, the wiring layer 6a) other than the lowest layer (here, the wiring layer 6s) of the multilayer wiring structure of the wiring layer 6. It is advantageous to provide the vertical signal line 18 in the wiring layer other than the lowest layer among the plural wiring layers included in the multilayer wiring structure because the coupling between the charge storage region 2fd and the vertical signal line 18 may more effectively be suppressed.

As illustrated in FIG. 11, the shield electrode sh3 may be formed between the vertical signal line 18 and the semiconductor substrate 2. The shield electrode sh3 may be a portion of the wiring layer 6. The shield electrode sh3 is arranged in the position that overlaps with the vertical signal line 18 when seen in the normal direction of the semiconductor substrate 2. The arrangement of the shield electrode sh3 enables the coupling between the charge storage region 2fd and the vertical signal line 18 to be more effectively suppressed.

FIG. 11 schematically illustrates the cross section of the unit pixel cell 50 in a case where the unit pixel cell 50 is sectioned along the cross section that is perpendicular to the direction in which the vertical signal line 18 extends and includes the contact plug cpa. As illustrated in FIG. 11, the vertical signal line 18 may be arranged above a region of the semiconductor substrate 2 that is located on the opposite side from the charge storage region 2fd across the contact plug cpa and in a position closer to the second electrode 15c than the contact plug cpa. The vertical signal line 18 may be arranged two-dimensionally and three-dimensionally separately from the charge storage region 2fd, and crosstalk due to the coupling between the charge storage region 2fd and the vertical signal line 18 may thereby be further reduced.

The features described about the feedback line 25 in the first embodiment apply to the vertical signal line 18 in the second embodiment in almost the same manner. For example, as described with reference to FIG. 6, the upper electrode 43e may be caused to function as a shield electrode. Further, for example, similarly to the example illustrated in FIG. 7, one of the source and the drain of the first reset transistor 36, which is not connected with the charge storage node 44, may be directly connected with the vertical signal line 18. Such connection results in an advantage of improving flexibility in the design of the impurity profile for securing driving power of the first reset transistor 36.

A camera system may be configured with the above-described imaging device 100 or imaging device 200 and an optical system that forms an image of an object on the light receiving surface 15h of the photoelectric conversion film 15b. A protective film, a color filter, a lens (micro-lens), and so forth may further be arranged on the first electrode 15a of the photoelectric conversion unit 15.

Third Embodiment

In the above embodiments, the electrode region 42c is provided on the semiconductor substrate 2, and the second capacitor 42 is formed as a so-called MIS capacitor. However, the configuration of the capacitor with a high capacitance in the signal detection circuit is not limited to the above-described examples. As described below, a capacitor that has a structure in which a dielectric is interposed between two electrodes formed of metal or a metal compound may be arranged in an interlayer insulating layer provided between the semiconductor substrate 2 and the photoelectric conversion unit 15, together with the second capacitor 42 or instead of the second capacitor 42. In the description made below, the structure in which the dielectric is interposed between the two electrodes formed of metal or a metal compound may be referred to as "metal-insulator-metal (MIM) structure". The capacitor arranged in the interlayer insulating layer between the semiconductor substrate 2 and the photoelectric conversion unit 15 is formed as a capacitor that has a so-called MIM structure, thereby facilitating obtainment of a larger capacitance value. That is, the dynamic range may be expanded by a simple configuration.

Figure 12:
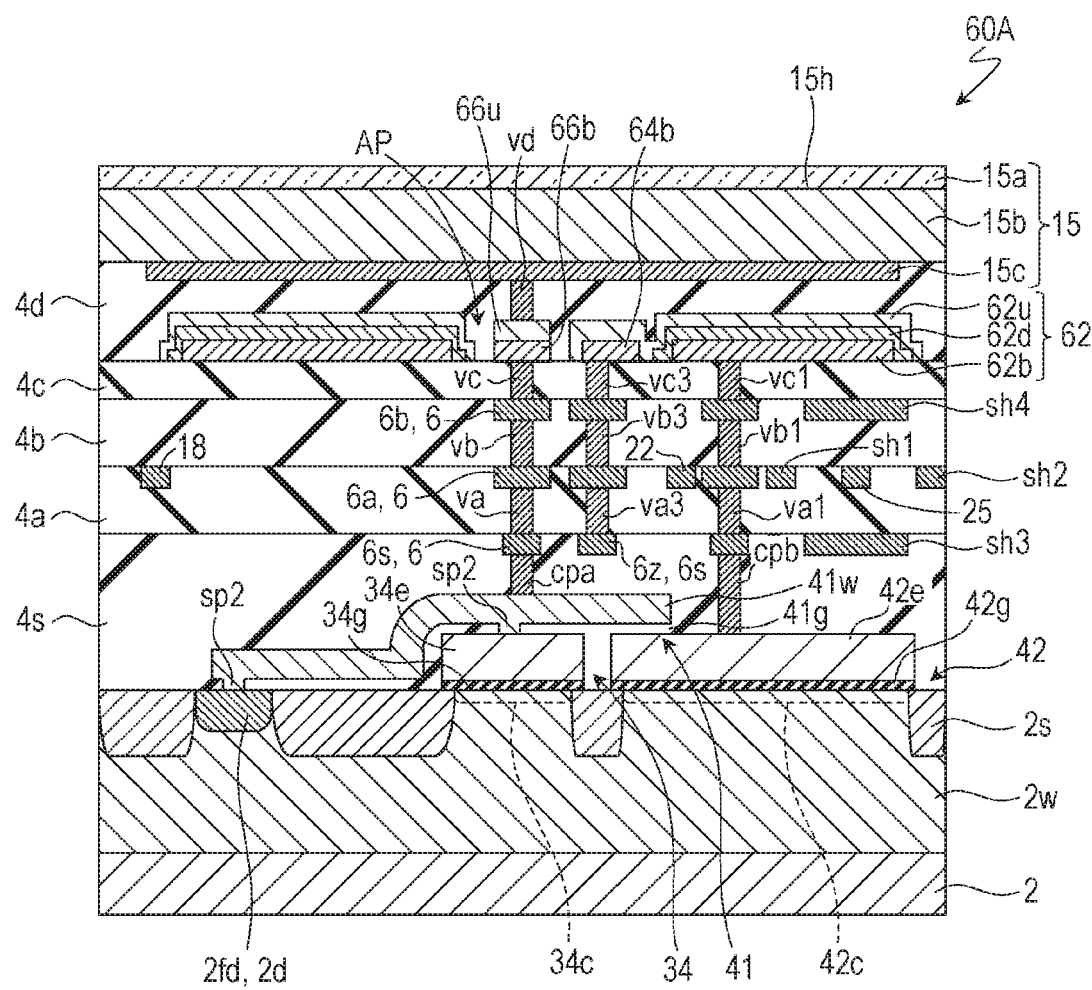
FIG. 12 is a schematic cross-sectional view that illustrates one example of a device structure of a unit pixel cell in an imaging device according to a third embodiment.

FIG. 12 schematically illustrates one example of the device structure of a unit pixel cell in an imaging device according to a third embodiment. The layout of elements on the semiconductor substrate 2 in a unit pixel cell 60A illustrated in FIG. 12 may be the same as the layout in the unit pixel cell 10 exemplified in FIG. 3, for example. FIG. 12 is a cross-sectional view that corresponds to the cross section taken along line XII-XII indicated in FIG. 3.

The unit pixel cell 60A illustrated in FIG. 12 has a capacitor 62 that is arranged between the semiconductor substrate 2 and the second electrode 15c. The capacitor 62 includes an upper electrode 62u, a lower electrode 62b, and a dielectric layer 62d that is arranged between the upper electrode 62u and the lower electrode 62b. As illustrated in FIG. 12, the lower electrode 62b is arranged more distantly from the second electrode 15c than the upper electrode 62u (that is, closer to the semiconductor substrate 2 than the upper electrode 62u).

Here, the lower electrode 62b is formed on the interlayer insulating layer 4c, and the capacitor 62 is covered by an interlayer insulating layer 4d that is provided between the interlayer insulating layer 4c and the photoelectric conversion unit 15. As described above, the lower electrode 62b and the upper electrode 62u may be arranged between the photoelectric conversion unit 15 and the gate electrode 34e of the amplifier transistor 34, and the interference between a wiring layer that includes the gate electrode 34e of the amplifier transistor 34 and the lower electrode 62b and the upper electrode 62u may thereby be suppressed. This enables the capacitor 62 that has a relatively large electrode area to be formed.

The lower electrode 62b is typically a metal electrode or a metal nitride electrode. Examples of materials for forming the lower electrode 62b include Ti, TiN, Ta, TaN, Mo, Ru, and Pt. The lower electrode 62b may be a portion of a wiring layer provided in the interlayer insulating layer 4d.

The dielectric layer 62d is laminated on the lower electrode 62b. In this example, the dielectric layer 62d covers a surface on the side opposed to the second electrode 15c and side surfaces on the lower electrode 62b.

The dielectric layer 62d may be formed of a different material (for example, metal oxide or metal nitride) from the material that configures the interlayer insulating layer 4d (typically silicon dioxide). In a case where the capacitor 62 is arranged in the interlayer insulating layer provided between the semiconductor substrate 2 and the photoelectric conversion unit 15, it is relatively easy to employ a material that has a relatively high dielectric constant as a material for forming the dielectric layer 62d. This facilitates realization of a relatively large capacitance value. Examples of materials for forming the dielectric layer 62d include oxides or nitrides that contain one or more kinds selected from the group consisting of Zr, Al, La, Ba, Ta, Ti, Bi, Sr, Si, Y, and Hf. The materials for forming the dielectric layer 62d may be binary compounds, ternary compounds, or quaternary compounds. As the materials for forming the dielectric layer 62d, for example, materials that have a relatively high dielectric constant such as $HfO_2$, $Al_2O_3$, $ZrO_2$, $TiO_2$, and $SrTiO_3$ may be used. The dielectric layer 62d may include two or more layers that are formed of mutually different materials.

The upper electrode 62u is laminated on the dielectric layer 62d. In this example, the upper electrode 62u covers a surface on the side opposed to the second electrode 15c and side surfaces on the dielectric layer 62d. The upper electrode 62u is typically a metal electrode or a metal nitride electrode. That is, here, the capacitor 62 has a so-called MIM structure. As the materials for forming the upper electrode 62u, the same materials as the materials for forming the lower electrode 62b may be used. The upper electrode 62u may be a portion of the wiring layer provided in the interlayer insulating layer 4d.

A protective layer formed of metal such as Cu or Al, polysilicon, or the like may be arranged between the upper electrode 62u and the dielectric layer 62d. The protective layer may be arranged between the upper electrode 62u and the dielectric layer 62d, and damage to the dielectric layer 62d in manufacturing steps may thereby be reduced. Thus, occurrence of leakage current between the upper electrode 62u and the lower electrode 62b may be suppressed.

The upper electrode 62u has an opening AP. A via vd, a connecting portion 66u, and a connecting portion 66b are arranged in the opening AP. The connecting portion 66u and the connecting portion 66b are in the same layers as the upper electrode 62u and the lower electrode 62b, respectively. As illustrated in FIG. 12, the second electrode 15c of the photoelectric conversion unit 15 is connected with the via vc, which is connected with the gate electrode 34e of the amplifier transistor 34, via the via vd, the connecting portion 66u, and the connecting portion 66b. The via vd may be formed of metal such as copper. The via vd, the connecting portion 66u, and the connecting portion 66b configure a portion of a charge storage region in the unit pixel cell 60A.

In the configuration exemplified in FIG. 12, the portion of the lower electrode 62b that is illustrated on the right side of the via vd is connected with the upper electrode 42e of the second capacitor 42 via a via vc1, the wiring layer 6b, a via vb1, the wiring layer 6a, a via va1, the wiring layer 6s, and a contact plug cpb provided in the interlayer insulating layer 4s. That is, the lower electrode 62b is connected with the reset drain node 46, which is not illustrated in FIG. 12. Here, the lower electrode 62b is a single electrode that is provided to each of the unit pixel cells 60A (see FIG. 13 which will be described below), and two portions of the lower electrode 62b that are separately illustrated on the left and right sides of the opening AP in FIG. 12 have equivalent voltages.

In this example, the upper electrode 62u covers a connecting portion 64b that is formed in the same layer as the lower electrode 62b. The connecting portion 64b is connected with wiring 6z that is a portion of the wiring layer 6s via a via vc3, the wiring layer 6b, a via vb3, the wiring layer 6a, and a via va3. The wiring 6z is connected with the sensitivity adjustment line 32, which is not illustrated in FIG. 12. That is, the capacitor 62 is connected with the above-described second capacitor 42 electrically in parallel and functions similarly to the second capacitor 42.

The capacitor 62 may be formed in the unit pixel cell 60A, and the second capacitor 42 may thereby be omitted. In a case where the second capacitor 42 is omitted, the region for the electrode region 42c does not have to be secured in the semiconductor substrate 2. This improves flexibility in the design of an element layout in the semiconductor substrate 2. For example, omitting the electrode region 42c enables the pixel size to be reduced. Alternatively, the size of the transistor (for example, the amplifier transistor 34) on the semiconductor substrate 2 may be increased. Increasing the size of the transistor enables non-uniformity of characteristics of the transistors to be reduced and thus enables non-uniformity of sensitivity among the unit pixel cells to be reduced. Further, increasing the size of the transistor improves driving performance (which may be considered as an improvement in mutual conductance gm) and thus enables noise to be further reduced.

In this example, the upper electrode 62u is electrically connected with the via vc3 on the surface on the opposite side from the surface that is opposed to the second electrode 15c of the photoelectric conversion unit 15. As described above, a contact for electric connection between the upper electrode 62u and the sensitivity adjustment line 32 may be provided on a surface that is closer to the semiconductor substrate 2, and complication of wiring may thereby be avoided. Further, the distance between the upper electrode 62u and the second electrode 15c of the photoelectric conversion unit 15 may be decreased, and the parasitic capacitance between the charge storage regions in the mutually adjacent pixels may thus be reduced.

A prescribed voltage is applied to the upper electrode 62u via the sensitivity adjustment line 32 while the imaging device (the imaging device 100 or the imaging device 200) is operating. Here, similarly to the lower electrode 62b, the upper electrode 62u is a single electrode that is provided to each of the unit pixel cells 60A (see FIG. 13 which will be described below), and two portions of the upper electrode 62u that are separately illustrated on the left and right sides of the opening AP in FIG. 12 have equivalent voltages.

Figure 13:
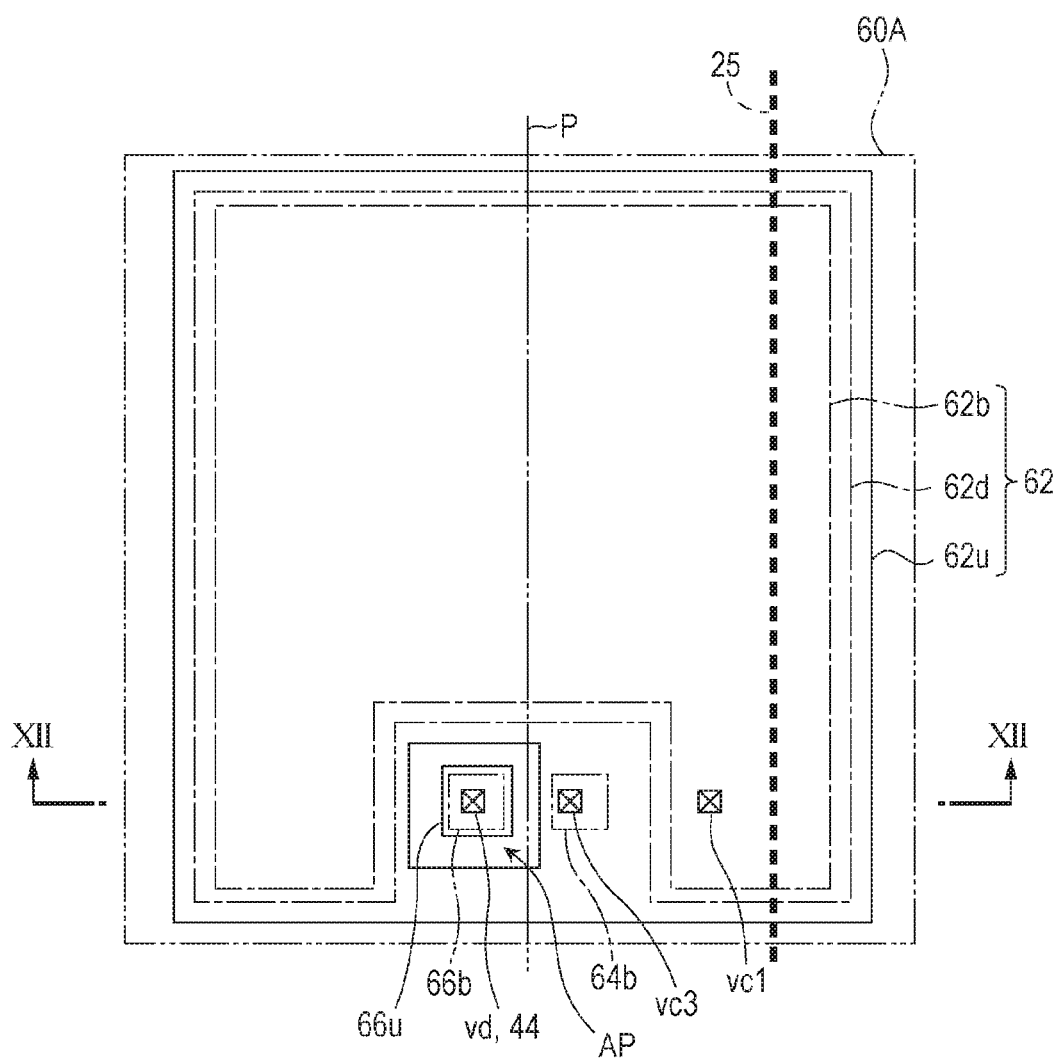
FIG. 13 is a schematic plan view that illustrates one example of arrangement of an upper electrode, a dielectric layer, and a lower electrode in the unit pixel cell illustrated in FIG. 12.

FIG. 13 illustrates one example of the arrangement of the upper electrode 62u, the dielectric layer 62d, and the lower electrode 62b in a case where the unit pixel cell 60A is seen in the normal direction of the semiconductor substrate 2. FIG. 13 has a cutting plane line XII-XII as in FIG. 3, an imaginary center line P, and the feedback line 25. As illustrated in FIG. 13, the shape of the upper electrode 62u do not have to match with the shape of the lower electrode 62b when seen in the normal line direction of the semiconductor substrate 2. It is sufficient that the upper electrode 62u includes a portion that is opposed to at least a portion of the lower electrode 62b when seen in the normal line direction of the semiconductor substrate 2.

In this example, the lower electrode 62b and the upper electrode 62u occupy a large region in the unit pixel cell 60A. The capacitor 62 may be the capacitor that has the largest electrode area in the capacitors provided in the unit pixel cell 60A when seen in the normal direction of the semiconductor substrate 2.

In the example illustrated in FIG. 13, the feedback line 25 is arranged in the position that overlaps with the capacitor 62. As described above, in this example, the upper electrode 62u is connected with the sensitivity adjustment line 32. Thus, in a case where the feedback line 25 is arranged between the photoelectric conversion unit 15 and the upper electrode 62u and a constant voltage is supplied to the upper electrode 62u via the sensitivity adjustment line 32 while the imaging device is operating, the electrode of the capacitor that has the largest electrode area in the unit pixel cell 60A (for example, the upper electrode 62u of the capacitor 62) may be caused to function as a shield electrode. The feedback line 25 may be arranged in the position that overlaps with the capacitor 62, and the upper electrode 62u (or the lower electrode 62b) may thereby be formed between the feedback line 25 and the semiconductor substrate 2 throughout the portion of the feedback line 25 that is included in the unit pixel cell 60A. Employing such wiring arrangement also enables the coupling capacitance between the charge storage region 2fd and the feedback line 25 to be reduced. The vertical signal line 18 may be arranged in the position that overlaps with the capacitor 62, and the coupling capacitance between the charge storage region 2fd and the vertical signal line 18 may thereby be reduced.

Further, the lower electrode 62b and the upper electrode 62u occupy a large region in the unit pixel cell 60A. Thus, at least one of the lower electrode 62b and/or the upper electrode 62u may be formed as a light-shielding electrode, and the lower electrode 62b or the upper electrode 62u may thereby be caused to function as a light-shielding layer. For example, the upper electrode 62u may be caused to function as the light-shielding layer, and the upper electrode 62u may thereby block the light that passes through gaps formed among the second electrodes 15c. Accordingly, incidence of the light that passes through the gaps formed among the second electrodes 15c on a channel region of the transistor (for example, the amplifier transistor 34) on the semiconductor substrate 2 may be suppressed. For example, as the upper electrode 62u, a TaN electrode with a thickness of 100 nm may be formed, and sufficient light-shielding performance may thereby be realized.

The third embodiment may suppress incidence of stray light on the channel region of the transistor on the semiconductor substrate 2 and may suppress a shift of the transistor characteristic (for example, a fluctuation in the threshold voltage). Incidence of stray light on the channel region of the transistor on the semiconductor substrate 2 may be suppressed, and the transistor characteristic of each pixel may thereby be stabilized, and non-uniform operations of the transistors among plural pixels may thereby be reduced. As described above, suppression of incidence of stray light on the channel region of the transistor on the semiconductor substrate 2 contributes to an improvement of reliability of the imaging device.

In the configuration exemplified in FIG. 13, the upper electrodes 62u are spatially separated from each other, and the upper electrodes 62u are thereby electrically separated among the plural unit pixel cells 60A. That is, in this example, there is a slight gap between the mutually adjacent upper electrodes 62u. However, here, the configuration is made such that a prescribed voltage is supplied to each of the upper electrodes 62u via the sensitivity adjustment line 32. Thus, the distances among the mutually adjacent upper electrodes 62*u* may be made sufficiently small compared to the distances among the mutually adjacent second electrodes 15*c*. Accordingly, the upper electrode 62*u* may block a large portion of the light that passes through the gaps formed among the second electrodes 15*c*. In the circuit configuration exemplified in FIG. 1, a common voltage is applied to the upper electrodes 62*u* in the unit pixel cells 60A that belong to the same row. Accordingly, plural belt-shaped electrodes that extend through the plural columns in the row direction may be used as the upper electrodes 62*u*. It is matter of course that the upper electrodes 62*u* may be spatially separated for the respective unit pixel cells 60A as illustrated in FIG. 13 and an independent voltage may be supplied to each of the upper electrode 62*u*.

In this example, the opening AP of the upper electrode 62*u* is formed in a lower portion of the unit pixel cell 60A in FIG. 13. However, the arrangement of the opening AP is not limited to this example. For example, the opening AP may be formed at the center of the unit pixel cell 60A, and the upper electrode 62*u* may thereby be formed to surround the connecting portion 66*u* and the connecting portion 66*b*. It is beneficial to arrange the opening AP at the center of the unit pixel cell 60A and to form the shape of the upper electrode 62*u* in a highly symmetrical shape with respect to the connecting portion 66*u* because imbalance in the capacitance in the unit pixel cell 60A may be reduced. The shape of the upper electrode 62*u* as seen in the normal direction of the semiconductor substrate 2 is not limited to the shape illustrated in FIG. 13. For example, the upper electrode 62*u* may include plural portions. The same applies to the dielectric layer 62*d* and the lower electrode 62*b*.

As described above, in this example, the upper electrode 62*u* is connected with the sensitivity adjustment line 32. Thus, a constant voltage is supplied to the upper electrode 62*u* via the sensitivity adjustment line 32, and the voltage of the upper electrode 62*u* during an operation of the imaging device may be made constant. Accordingly, the upper electrode 62*u* may be formed to surround the connecting portion 66*u* and the connecting portion 66*b*, a constant voltage may be applied to the upper electrode 62*u*, and the upper electrode 62*u* may thereby be caused to function as a shield electrode. The upper electrode 62*u* functions as a shield electrode, and entrance of noise into the charge storage node 44 may thereby be suppressed.

As described above, in the third embodiment, the capacitor 62 is arranged between the upper electrode 41*w* and the second electrode 15*c* of the photoelectric conversion unit 15 as the capacitor that is connected between the reset drain node 46 and the sensitivity adjustment line 32. As exemplified in FIG. 12, the capacitor 62 is arranged in the interlayer insulating layer (for example, the interlayer insulating layer 4*d*) of the unit pixel cell 60A. Accordingly, the capacitor 62 may be formed as a capacitor that has a so-called MIM structure. That is, this facilitates obtainment of a relatively large capacitance value in the capacitor 62. Such a configuration also enables kTC noise that occurs accompanying resetting to be decreased, similarly to the first and second embodiments described above. Further, it is advantageous to have the capacitor 62 with a high capacitance for photographing under high illumination because the capacitance of a whole storage region of the signal charge may be increased.

(Formation Method of Capacitor 62)

An outline of manufacturing steps for forming the capacitor 62 will be described below.

After formation of the vias vc, vc1, and vc3, the lower electrode 62*b*, the connecting portion 66*b*, and the connecting portion 64*b* are formed on the interlayer insulating layer 4*c*. Here, TaN is used as the material for forming the lower electrode 62*b*, the connecting portion 66*b*, and the connecting portion 64*b*. Photo-lithography that is introduced to common semiconductor processing may be applied to formation of the lower electrode 62*b*, the connecting portion 66*b*, and the connecting portion 64*b* onto the interlayer insulating layer 4*c*. A material of the dielectric layer 62*d* is thereafter deposited to form a dielectric film, and patterning of the dielectric film is executed.

For example, atomic layer deposition (ALD) may be applied to formation of the dielectric film. The ALD enables mutually different atoms to be laminated by several atoms. Here, a film of an oxide of Hf is formed as the dielectric film. In the formation of the film of the oxide of Hf, tetrakis (ethylmethylamido)hafnium is used as a precursor, and plasma discharge is performed after introduction of the precursor. Plasma discharge is performed under an oxygen atmosphere, and oxidation of Hf is thereby promoted. The above-described steps are repeated to laminate $HfO_2$ by one layer. For example, a film with a thickness of 22 nm is formed by repeating introduction of the gaseous precursor and plasma discharge 250 times.

Photo-lithography that is introduced to common semiconductor processing may be applied to patterning of the dielectric film. The dielectric layer 62*d* is formed by patterning of the dielectric film. The dielectric layer 62*d* may be a single integral film or may include plural portions that are arranged in mutually different locations on the lower electrode 62*b*.

After formation of the dielectric layer 62*d*, the upper electrode 62*u* and the connecting portion 66*u* are formed similarly to the lower electrode 62*b*. Subsequently, the interlayer insulating layer 4*d* and the via vd are formed, the photoelectric conversion unit 15 is formed on the interlayer insulating layer 4*d*, and the device structure illustrated in FIG. 12 may thereby be obtained.

A metal nitride such as TiN, TaN, or WN may be used to form the second electrode 15*c* of the photoelectric conversion unit 15. Metal nitrides have high airtightness and have the property that movement and/or entrance of impurity elements are less likely to occur at a high temperature. Thus, the upper electrode 62*u* located above the dielectric layer 62*d* is formed by using a metal nitride (here, TaN), the second electrode 15*c* is formed by using a metal nitride, and entrance of carriers due to impurities into the dielectric layer 62*d* may thereby be hindered. Entrance of impurities into the dielectric layer 62*d* is hindered, and leakage current between the upper electrode 62*u* and the lower electrode 62*b* in the capacitor 62 may thereby be reduced.

Further, migration of metal nitrides is less likely to occur in spattering, thereby facilitating formation of a flat surface. A metal nitride may be used to form the second electrode 15*c* of the photoelectric conversion unit 15, and contacts via flat interfaces may thereby be realized. Unevenness of the surface of the second electrode 15*c* is suppressed, and smooth charge transportation between the second electrode 15*c* and the photoelectric conversion film 15*b* may thereby be realized. Further, occurrence of a level due to interface defects is suppressed, and dark current may thereby be suppressed. As described above, it is beneficial to form both of the upper electrode 62*u* of the capacitor 62 and the second electrode 15*c* of the photoelectric conversion unit 15 of metal nitrides, in view of reduction in leakage current and dark current. In addition, it is beneficial to form the lower electrode 62*b* of the capacitor 62 by using a metal nitride because flatness of the upper electrode 62*u* may further be improved. Further, using a metal nitride is beneficial because oxidation of the dielectric layer 62d may be suppressed.

Here, the configuration in which the capacitor 62 is added to the configuration illustrated in FIG. 4 is exemplified. Needless to say, configurations are possible in which the above-described capacitor 62 is added to the configuration illustrated in FIG. 6 and the configuration illustrated in FIG. 11. It is matter of course that a configuration is possible in which the vertical signal line 18 is arranged instead of the feedback line 25 illustrated in FIG. 13, for example.

First Modification Example of Third Embodiment

Figure 14:
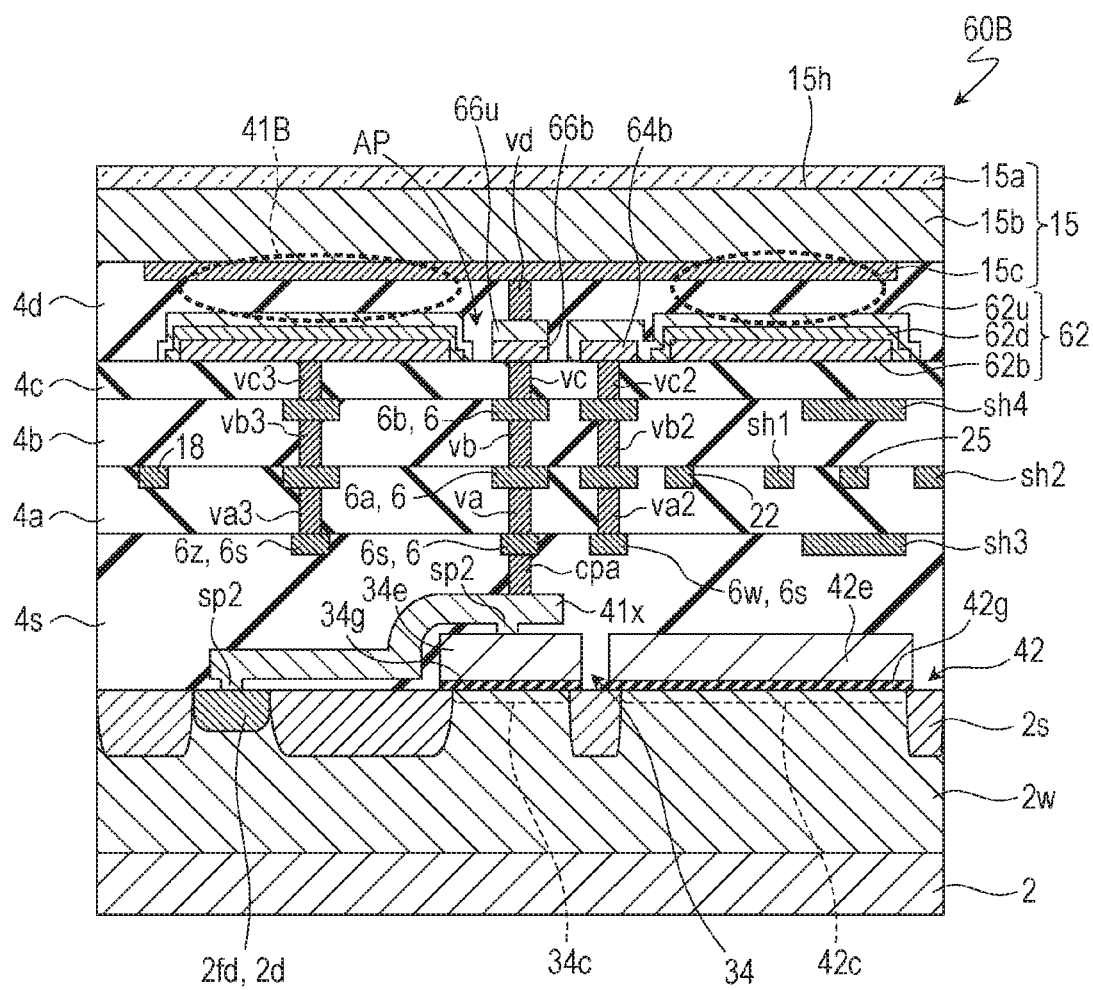
FIG. 14 is a schematic cross-sectional view that illustrates another example of the device structure of the unit pixel cell of the imaging device according to the third embodiment.
Figure 15:
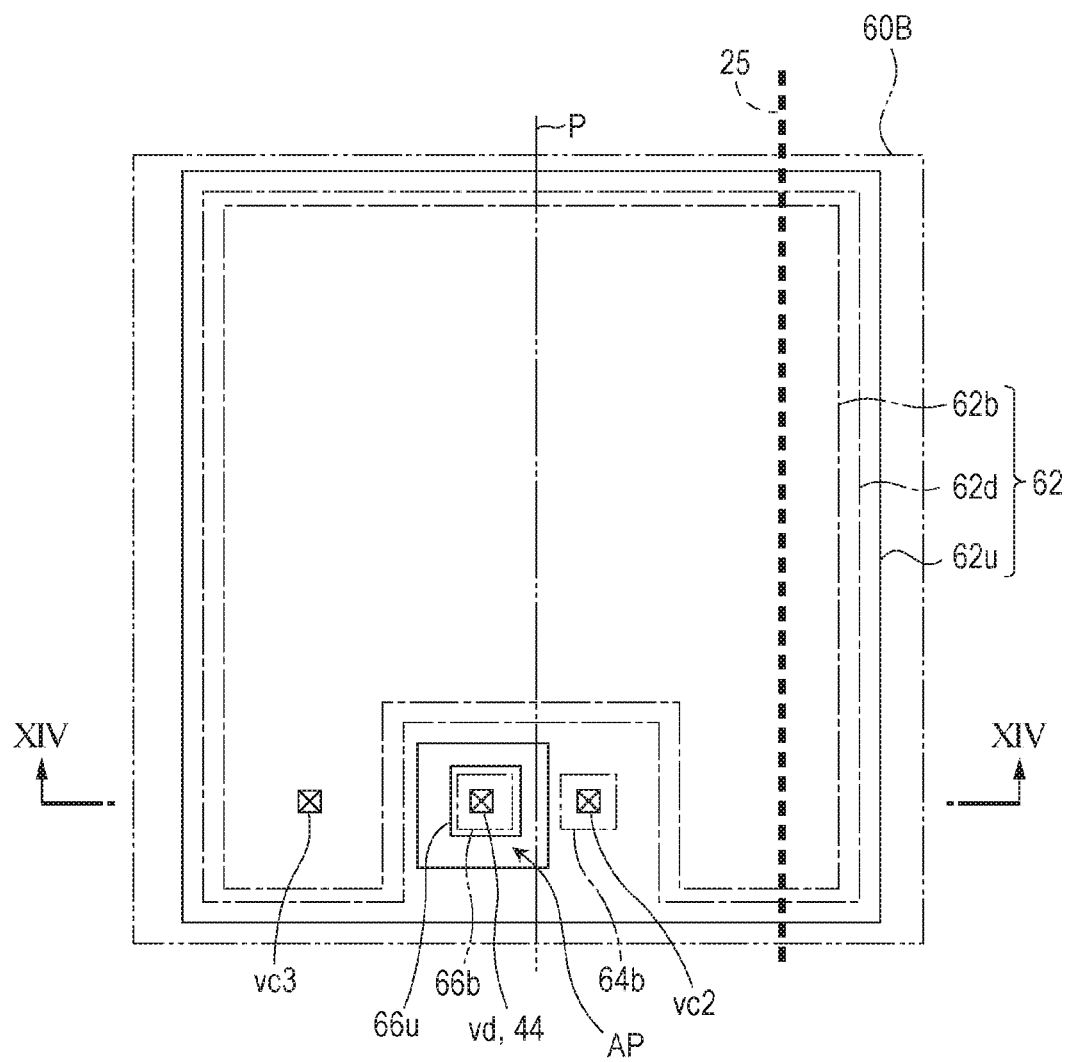
FIG. 15 is a schematic plan view that illustrates one example of the arrangement of the upper electrode, the dielectric layer, and the lower electrode in the unit pixel cell illustrated in FIG. 14.

FIG. 14 schematically illustrates another example of the device structure of the unit pixel cell in the imaging device according to the third embodiment. FIG. 15 illustrates one example of the arrangement of the upper electrode 62u, the dielectric layer 62d, and the lower electrode 62b in a case where a unit pixel cell 60B illustrated in FIG. 14 is seen in the normal direction of the semiconductor substrate 2. FIG. 14 is a cross-sectional view that corresponds to the cross section taken along line XIV-XIV indicated in FIG. 15. The main difference between the unit pixel cell 60B illustrated in FIGS. 14 and 15 and the unit pixel cell 60A described with reference to FIGS. 12 and 13 is the point that the upper electrode 62u and the lower electrode 62b are connected with the reset drain node 46 and the sensitivity adjustment line 32, respectively.

As illustrated in FIG. 14, in this example, the upper electrode 62u is connected with wiring 6w that is a portion of the wiring layer 6s via the connecting portion 64b, a via vc2, the wiring layer 6b, a via vb2, the wiring layer 6a, and a via va2. The wiring 6w is connected with the reset drain node 46. That is, the upper electrode 62u is connected with the reset drain node 46. Meanwhile, the lower electrode 62b is connected with wiring 6z via the via vc3, the wiring layer 6b, the via vb3, the wiring layer 6a, and the via va3. That is, the lower electrode 62b is connected with the sensitivity adjustment line 32. That is, in this example also, the capacitor 62 is connected between the reset drain node 46 and the sensitivity adjustment line 32. Accordingly, the capacitor 62 functions similarly to the above-described second capacitor 42. Further, in this example, the lower electrode 62b is connected with the sensitivity adjustment line 32. Thus, the voltage of the lower electrode 62b may be controlled via the sensitivity adjustment line 32. The voltage of the lower electrode 62b is controlled, the voltage of the charge storage node 44 may thereby be controlled, and the sensitivity of the imaging device may thereby be adjusted. A constant voltage may be supplied to the lower electrode 62b via the sensitivity adjustment line 32 while the imaging device is operating, and the lower electrode 62b may thereby be caused to function as a shield electrode.

As illustrated in FIG. 14, in this example, an upper electrode 41x that connects the charge storage region 2fd (the source or the drain of the first reset transistor 36) with the gate electrode 34e of the amplifier transistor 34 does not extend to a portion above the upper electrode 42e of the second capacitor 42. In other words, the upper electrode 41x does not overlap with the upper electrode 42e when seen in the normal direction of the semiconductor substrate 2. Accordingly, the unit pixel cell 60B does not have the first capacitor 41 that has two polysilicon layers opposed to each other and the insulating layer interposed between the two polysilicon layers in the interlayer insulating layer 4s.

Here, focusing on the photoelectric conversion unit 15 and the capacitor 62, the second electrode 15c of the photoelectric conversion unit 15 and the upper electrode 62u of the capacitor 62 are opposed to each other via the interlayer insulating layer 4d. As described above, in this example, the upper electrode 62u is connected with the reset drain node 46. That is, a capacitor 41B that is formed with the second electrode 15c, the upper electrode 62u, and the interlayer insulating layer 4d may be considered as a capacitor that is connected between the charge storage node 44 and the reset drain node 46. For example, as understood from the circuit configuration illustrated in FIG. 2, the capacitor 41B functions similarly to the above-described first capacitor 41.

As described above, instead of the first capacitor 41, the capacitance that is formed between the second electrode 15c of the photoelectric conversion unit 15 and the upper electrode 62u of the capacitor 62 may be used as a capacitor with a low capacitance. In such a configuration also, in a case where a sufficiently large capacitance value may be obtained by the capacitor 62, the second capacitor 42 formed as a so-called MIS capacitor may be omitted.

In FIG. 14, for example, as the upper electrode 41w illustrated in FIG. 12, the upper electrode 41x may extend to a portion above the upper electrode 42e of the second capacitor 42. However, in view of decreasing noise and suppressing lowering of the conversion gain, it is advantageous that the upper electrode 41x does not overlap with the upper electrode 42e of the second capacitor 42.

The manufacturing method of the unit pixel cell 60B may be almost the same as the manufacturing method of the unit pixel cell 60A other than the point that the pattern of the resist mask for forming the upper electrode 41x and the pattern of the resist mask for forming the wiring layer 6s are different. Thus, a description about the manufacturing method of the unit pixel cell 60B will not be made.

Second Modification Example of Third Embodiment

Figure 16:
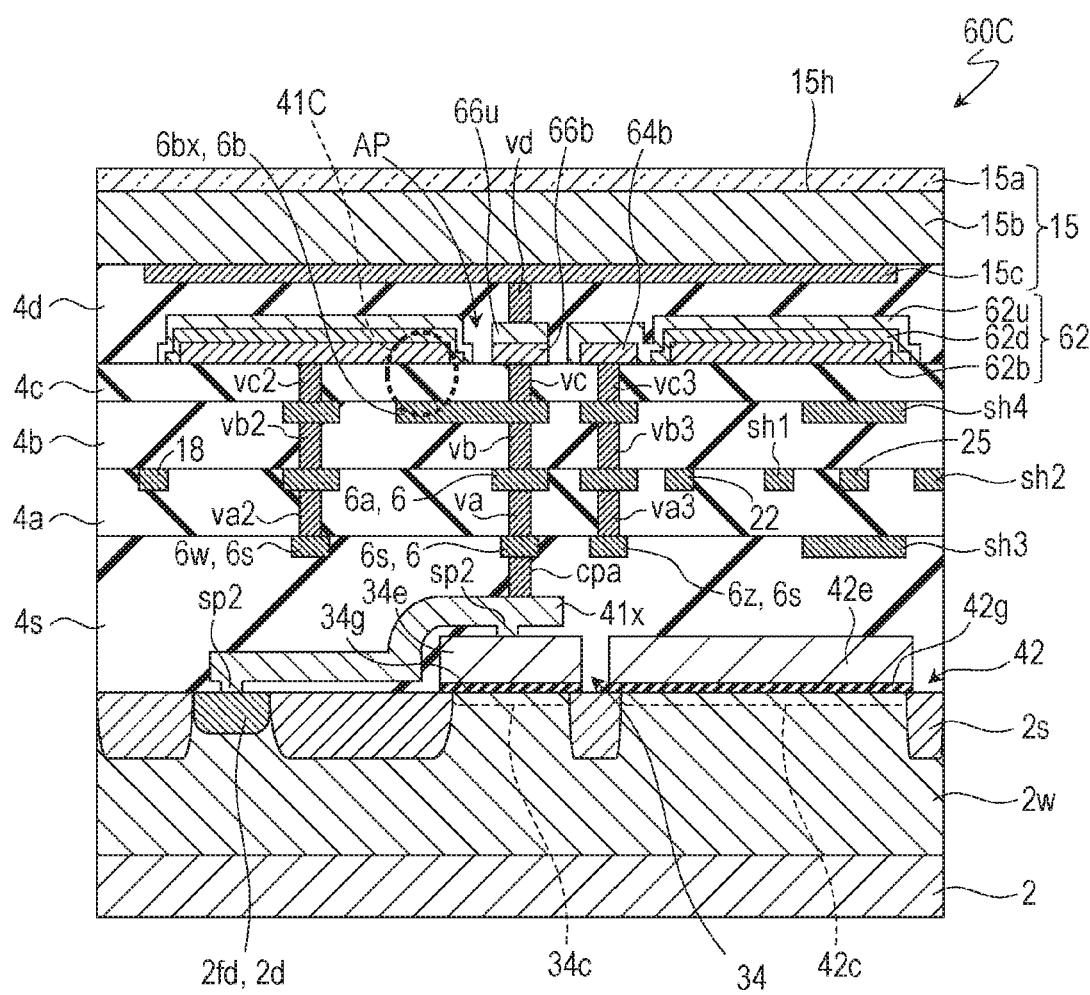
FIG. 16 is a schematic cross-sectional view that illustrates still another example of the device structure of the unit pixel cell of the imaging device according to the third embodiment.
Figure 17:
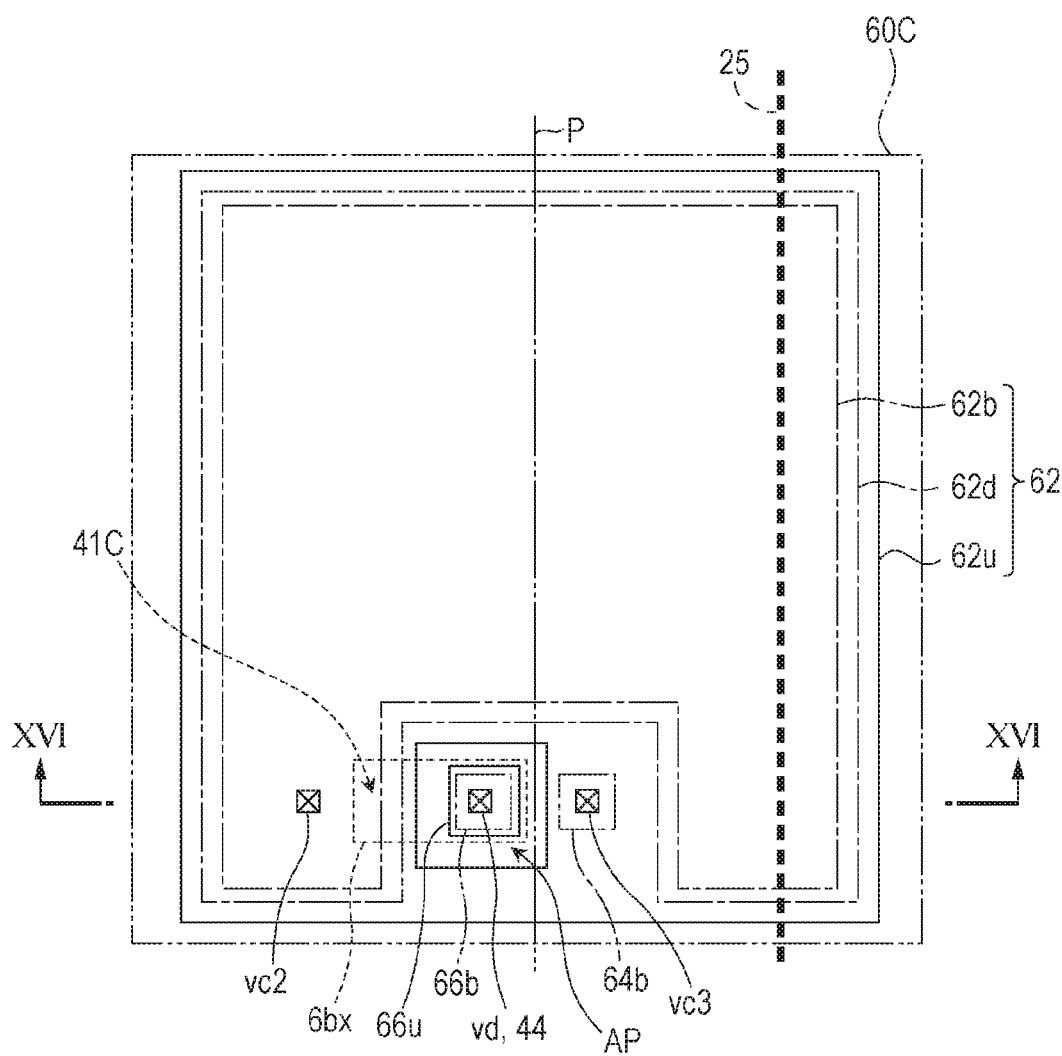
FIG. 17 is a schematic plan view that illustrates one example of the arrangement of the upper electrode, the dielectric layer, and the lower electrode in the unit pixel cell illustrated in FIG. 16.

FIG. 16 schematically illustrates still another example of the device structure of the unit pixel cell in the imaging device according to the third embodiment. FIG. 17 illustrates one example of the arrangement of the upper electrode 62u, the dielectric layer 62d, and the lower electrode 62b in a case where a unit pixel cell 60C illustrated in FIG. 16 is seen in the normal direction of the semiconductor substrate 2. FIG. 16 is a cross-sectional view that corresponds to the cross section taken along line XVI-XVI indicated in FIG. 17. The main difference between the unit pixel cell 60C illustrated in FIGS. 16 and 17 and the unit pixel cell 60A described with reference to FIGS. 12 and 13 is the point that, instead of the first capacitor 41, a capacitor 41C with a low capacitance, which has the lower electrode 62b as one of the electrodes, is formed in the interlayer insulating layer.

Similarly to the unit pixel cell 60A described with reference to FIG. 12, in the unit pixel cell 60C exemplified in FIG. 16, the lower electrode 62b and the upper electrode 62u are connected with the reset drain node 46 and the sensitivity adjustment line 32, respectively. The unit pixel cell 60C does not have the first capacitor 41 in the interlayer insulating layer 4s, similarly to the unit pixel cell 60B described with reference to FIG. 14.

In the configuration exemplified in FIG. 16, the wiring layer 6b formed in the interlayer insulating layer 4b includes an electrode 6bx that is arranged between the via vc and the via vb. As schematically illustrated in FIGS. 16 and 17, the electrode 6bx has a portion that overlaps with the lower electrode 62b when seen in the normal direction of the semiconductor substrate 2. That is, at least a portion of the electrode 6bx is opposed to at least a portion of the lower electrode 62b via at least a portion of the interlayer insulating layer 4c. Accordingly, the capacitor 41C is formed between the capacitor 62 and a wiring layer (here, the electrode 6bx) that is arranged in the interlayer insulating layer (here, the interlayer insulating layer 4c). A portion of the interlayer insulating layer 4c that is interposed between the lower electrode 62b and the electrode 6bx functions as a dielectric layer in the capacitor 41C. The lower electrode 62b is connected with the reset drain node 46, and the electrode 6bx is connected with the second electrode 15c. Thus, the capacitor 41C functions similarly to the above-described first capacitor 41.

As described above, a capacitor may be formed between the capacitor 62 and the wiring layer arranged in the interlayer insulating layer. In such a configuration, the capacitor with a low capacitance (for example, approximately 0.5 fF) may relatively easily be arranged in the unit pixel cell. In this example, a portion of the wiring layer 6b (here, the electrode 6bx) is used as one of the electrodes of the capacitor with a low capacitance. However, one of the electrodes of the capacitors with a low capacitance may be a portion of another wiring layer such as the wiring layer 6a or 6s. Also in the configuration described with reference to FIGS. 16 and 17, in a case where a sufficiently large capacitance value may be obtained by the capacitor 62, the second capacitor 42 formed as a so-called MIS capacitor may be omitted.

The manufacturing method of the unit pixel cell 60C may be almost the same as the manufacturing method of the unit pixel cell 60A other than the point that the pattern of the resist mask for forming the upper electrode 41x and the pattern of the resist mask for forming the electrode 6bx are different. Thus, a description about the manufacturing method of the unit pixel cell 60C will be omitted.

The embodiments of the present disclosure enable the influence of kTC noise to be reduced. The embodiments of the present disclosure are useful for digital cameras and so forth.

What is claimed is:

1. An imaging device comprising:
    a semiconductor substrate;
    a first pixel and a second pixel that are arranged in a first direction, each of the first pixel and the second pixel including:
        a photoelectric converter that converts incident light into signal charge;
        a impurity region in the semiconductor substrate, the impurity region being coupled to the photoelectric converter and accumulating the signal charge;
        a first transistor having a first gate, a first source and a first drain, the first gate being coupled to the impurity region and outputting a signal according to a potential of the impurity region; and
        a second transistor having a second gate, a second source and a second drain, the second transistor including the impurity region as one of the second source and the second drain, the other of the second source and the second drain being coupled to either the first source or the first drain not through an inverting amplifier; and
    a signal line that extends along the first direction and that overlaps with both of the first pixel and the second pixel in a plan view, one of the first source and the first drain being coupled to the signal line, the signal being input to the signal line; wherein
    in the plan view, the signal line is located on an opposite side from the impurity region across a center line of the first pixel, the center line being in parallel with the first direction and being an imaginary center line that halves, in the plan view, the first pixel.

2. The imaging device according to claim 1, wherein the first pixel and the second pixel each include a third transistor, the other of the second source and the second drain being coupled to either the first source or the first drain via the third transistor.

3. The imaging device according to claim 1, further comprising
    voltage switching circuitry that is coupled to the other of the first source and the first drain, the voltage switching circuitry being configured to switch voltage supply to the other of the first source and the first drain between a first voltage and a second voltage different from the first voltage.

4. The imaging device according to claim 1, wherein the photoelectric converter includes a first electrode, a second electrode and a photoelectric conversion layer between the first electrode and the second electrode, the second electrode being coupled to the impurity region.

5. The imaging device according to claim 4, wherein
    the first pixel and the second pixel each include
        a first capacitor having a first end and a second end, the first end being coupled to the impurity region, the first capacitor having a first capacitance value, and
        a second capacitor that has a second capacitance value greater than the first capacitance value.

6. The imaging device according to claim 5, wherein
    the second capacitor includes
        a third electrode that is located between the semiconductor substrate and the second electrode,
        a fourth electrode that is located more apart from the second electrode than the third electrode is, and
        a first dielectric layer that is located between the third electrode and the fourth electrode.

7. The imaging device according to claim 5, wherein the signal line overlaps with the second capacitor in the plan view.

8. The imaging device according to claim 6, wherein the fourth electrode includes an impurity region in the semiconductor substrate.

9. The imaging device according to claim 5, wherein the first capacitor is coupled between the second source and the second drain.

10. The imaging device according to claim 1, wherein the photoelectric converter is located above the semiconductor substrate.

11. The imaging device according to claim 10, further comprising
    at least one wiring layer that is located between the semiconductor substrate and the photoelectric converter, the signal line being included in the at least one wiring layer.

12. The imaging device according to claim 10, further comprising
    at least one wiring layer that is located between the semiconductor substrate and the photoelectric converter, the signal line being included in one of the at least one wiring layer.

13. The imaging device according to claim 11, wherein the at least one wiring layer includes wiring layers, and the signal line is included in one of the wiring layers other than a wiring layer located closest to the semiconductor substrate among the wiring layers.

14. The imaging device according to claim 11, wherein the at least one wiring layer includes a shield electrode located between the signal line and the semiconductor substrate, the shield electrode overlapping with the signal line in the plan view.

\* \* \* \* \*

UNITED STATES PATENT AND TRADEMARK OFFICE
CERTIFICATE OF CORRECTION

PATENT NO. : 11,223,786 B2
APPLICATION NO. : 16/243921
DATED : January 11, 2022
INVENTOR(S) : Yoshihiro Sato et al.

It is certified that error appears in the above-identified patent and that said Letters Patent is hereby corrected as shown below:

On the Title Page

Item (30) Foreign Application Priority Data, should read:
-- Dec. 26, 2014 (JP)...................... 2014-264697
Oct. 21, 2015 (JP)...................... 2015-207382 --

Signed and Sealed this
Thirty-first Day of May, 2022

Katherine Kelly Vidal
*Director of the United States Patent and Trademark Office*